(12) United States Patent
Winter

(10) Patent No.: US 8,808,788 B2
(45) Date of Patent: Aug. 19, 2014

(54) PROCESSING A WAFER WITH A POST APPLICATION BAKE (PAB) PROCEDURE

(75) Inventor: Thomas E. Winter, Parsonsfield, ME (US)

(73) Assignee: Tokyo Electron Limited, Tokyo (JP)

( * ) Notice: Subject to any disclaimer, the term of this patent is extended or adjusted under 35 U.S.C. 154(b) by 263 days.

(21) Appl. No.: 12/886,361

(22) Filed: Sep. 20, 2010

(65) Prior Publication Data

US 2012/0070564 A1 Mar. 22, 2012

(51) Int. Cl.
*C23C 16/52* (2006.01)
*C23C 16/44* (2006.01)
*C23C 16/46* (2006.01)
*C23C 16/56* (2006.01)

(52) U.S. Cl.
CPC ............. *C23C 16/46* (2013.01); *C23C 16/4412* (2013.01); *C23C 16/4401* (2013.01); *C23C 16/52* (2013.01); *C23C 16/56* (2013.01)
USPC ............................................................ 427/8

(58) Field of Classification Search
USPC ............................................................ 427/8
See application file for complete search history.

(56) References Cited

U.S. PATENT DOCUMENTS

| | | | |
|---|---|---|---|
| 5,826,129 A | 10/1998 | Hasebe et al. | |
| 5,989,763 A * | 11/1999 | Bendik et al. | 430/30 |
| 6,191,394 B1 | 2/2001 | Shirakawa et al. | |
| 6,228,171 B1 | 5/2001 | Shirakawa | |
| 6,229,116 B1 * | 5/2001 | Shirakawa et al. | 219/390 |
| 6,251,549 B1 | 6/2001 | Levenson | |
| 6,507,770 B2 | 1/2003 | Tateyama et al. | |
| 6,524,755 B2 | 2/2003 | Jin et al. | |
| 6,573,031 B2 * | 6/2003 | Shinya et al. | 430/325 |
| 6,955,928 B1 | 10/2005 | Brennan | |
| 6,966,235 B1 | 11/2005 | Paton | |
| 7,101,816 B2 | 9/2006 | Kaushal et al. | |
| 7,230,258 B2 | 6/2007 | Ruzic et al. | |
| 7,445,446 B2 | 11/2008 | Weichert et al. | |
| 7,452,793 B2 | 11/2008 | Kaushal et al. | |
| 7,483,804 B2 | 1/2009 | Scheer | |
| 7,515,264 B2 | 4/2009 | Otsuki et al. | |
| 7,528,386 B2 | 5/2009 | Ruzic et al. | |
| 2003/0147075 A1 | 8/2003 | Otsuki et al. | |
| 2006/0188398 A1 | 8/2006 | Yano et al. | |
| 2006/0237667 A1 | 10/2006 | Ruzic et al. | |
| 2006/0241891 A1 | 10/2006 | Kaushal et al. | |
| 2008/0079934 A1 | 4/2008 | Scheer | |
| 2008/0099181 A1 * | 5/2008 | Ramanan et al. | 165/61 |
| 2008/0102412 A1 | 5/2008 | Weichert et al. | |
| 2009/0013932 A1 * | 1/2009 | Sakamoto | 118/719 |

FOREIGN PATENT DOCUMENTS

WO WO 01/18607 * 3/2001
WO WO2007140012 A2 12/2007

* cited by examiner

*Primary Examiner* — Brian K Talbot
(74) *Attorney, Agent, or Firm* — Manuel B. Madriaga

(57) ABSTRACT

An Exhaust Gas Analyzer (EGA) subsystem for monitoring exhaust gasses, for controlling and rapidly adjusting the processing conditions within a processing chamber in a thermal processing unit used for heating-treating wafers before and/or during Post Application Bake (PAB) procedures. The EGA subsystem can be used to control and/or optimize the heat-treating of coated wafers at different bake plate temperatures, and the EGA subsystem can provide a high wafer throughput.

18 Claims, 10 Drawing Sheets

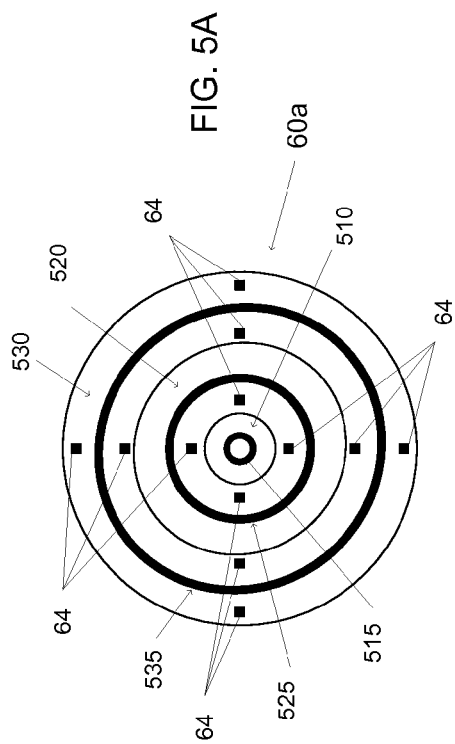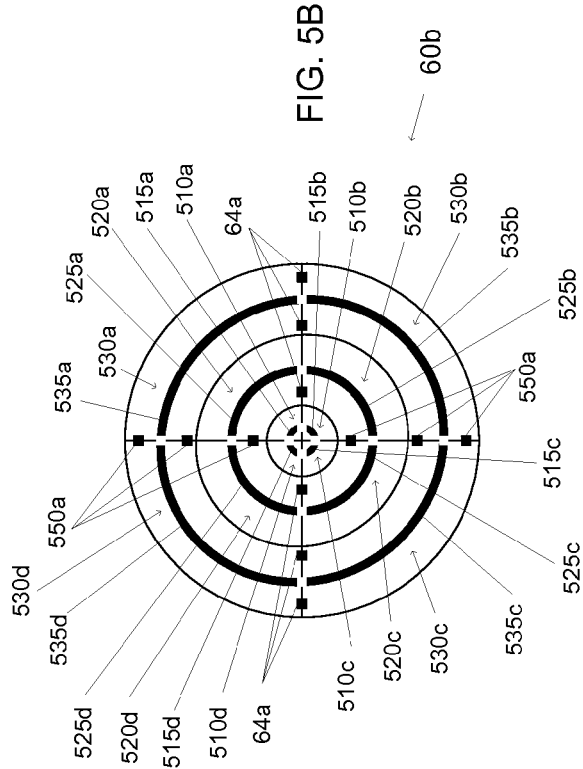

PROCESSING A WAFER WITH A POST APPLICATION BAKE (PAB) PROCEDURE

FIELD OF THE INVENTION

The invention relates to wafer processing, and more particularly, to a bake plate lid exhaust monitor and method for using.

BACKGROUND OF THE INVENTION

The baking (curing) of organic films is critical to the manufacturing process used for all integrated circuits. This process is called "post apply bake" or PAB. Typical films include topcoat barrier layers (TC), topcoat antireflective layers (TARC), bottom antireflective layers (BARC), imaging layers (PR or photoresist) and sacrificial and barrier layers (hard mask) for etch stopping.

The bake process time and temperature are used to drive out solvents and cure or harden the film and thereby define the characteristics of the film at exposure and post exposure develop where the circuit feature is defined, prior to etching the feature into the substrate. By-products of the bake process are sublimation products (solids) and out-gassing (liquid) materials. These byproducts can build up on the interior of the bake chamber and in the exhaust lines causing defects to fall onto the wafer in process. Typically, a cleaning of the bake system is required when these byproducts build up to certain levels. These methods may not be sensitive enough in future designs to meet sub 32 nm processing requirements. Minimizing defects during wafer processing will continue to be a critical path to attaining cost effective manufacturing of advanced semiconductor devices. Hard particles can block etch processes causing electrical "open" or "short" in the circuit. In lesser size and if lucky with the location on the device, the hard particle may only create fatal perturbations in the active features' critical dimension (line/space or contact hole)

One source for hard particle defect generation in the imaging process is the post application bake process. In these processes, solvent rich, polymer containing spun on films are baked at temperatures close to and even well above the boiling point (temperature) of the casting solvent used. Temperatures range from 80 to 250 C. The most common byproduct of the post apply bake is volatile organic compounds (VOC's) and in some amount of polymer or other "hard" material that deposits on the inside of the bake chamber. This material builds up and will start to shed or peel off creating particles with time, usually within 4,000 to 15,000 wafers processed. The degree of particles generated depends on chemistry and bake temperature. The lid is of course mounted directly above the production wafer so anything that comes loose will fall onto the production wafer.

Current solutions for this is to cool down the bake system, remove the bake plate lid and clean it in various chemicals or dunk it in a bath of solvent. Then reassemble the bake system and test for process compliance. This can take 4 to 6 hours during which time the tool is unusable for manufacturing.

It is Anticipated More Frequent Cleaning of Bake Plate Lids Will be Required to meet the future device defect densities.

SUMMARY OF THE INVENTION

Embodiments of the invention provide an Exhaust Gas Analyzer (EGA) subsystem for monitoring exhaust gasses for controlling and rapidly adjusting the processing conditions within a processing chamber in a thermal processing unit used for heating-treating wafers before and/or during Post Application Bake (PAB) procedures. Embodiments of the invention may be applied to heat-treating of coated wafers at different bake plate temperatures with high wafer throughput.

Embodiments of the invention described herein provide a system and method for monitoring the material build-up between an optical source and optical receiver in the exhaust line of a thermal processing unit during PAB procedures. As material builds up on the monitoring windows, the measured optical signal level is reduced. When the measured optical signal level exceeds a user defined adjustable low level, an alarm condition can be established, and a cleaning cycle can be performed.

According to one embodiment, the method includes providing one or more PAB temperature profiles to a coated wafer positioned on a bake plate in a thermal processing unit during a PAB procedure. The PAB temperature profiles can be created and/or updated using exhaust (trace) gas data from an EGA subsystem. At least one controller can be configured for monitoring the temperature profile of the bake plate, analyzing the exhaust (trace) gas data, and for controlling the bake plate temperature in response to the exhaust (trace) gas data during the PAB procedure.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIGS. 5A-5B illustrate simplified views of exemplary bake plates in accordance with embodiments of the invention;

DETAILED DESCRIPTION OF SEVERAL EMBODIMENTS

Embodiments of the invention provide a method and processing system for rapidly controlling the temperature of a bake plate used for supporting and curing wafers during Post Application Bake (PAB) procedures. Embodiments of the invention may be applied to curing of resist-coated wafers with high wafer throughput. The terms "wafer" and "substrate" are used interchangeably herein to refer to a thin slice of material, such as a silicon wafer or glass substrate, upon which microcircuits are constructed, for example by diffusion, deposition, and etching of various materials.

Figure 1:
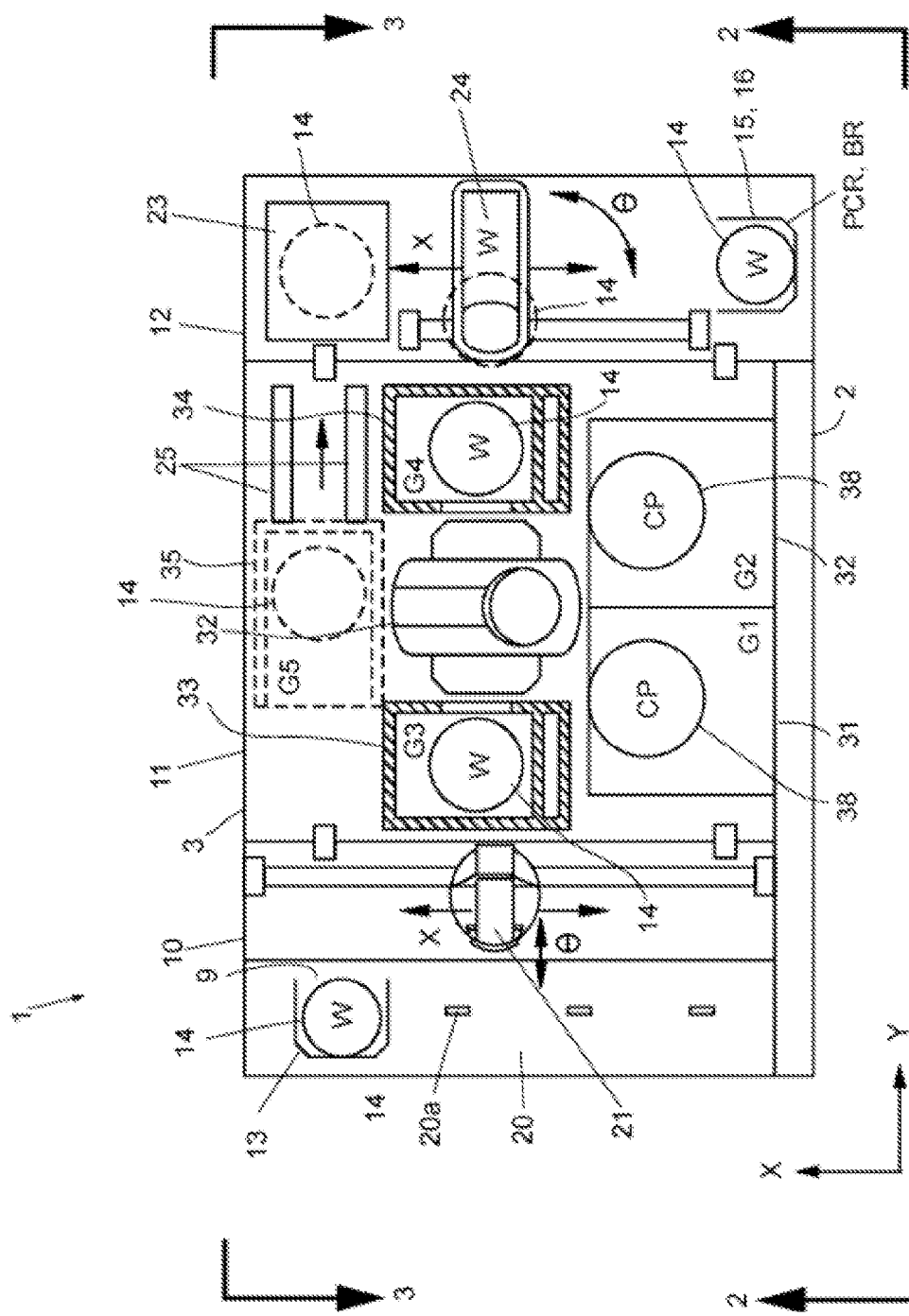
FIG. 1 is a top view of a schematic diagram of a coating/developing system for use in accordance with embodiments of the invention.
Figure 2:
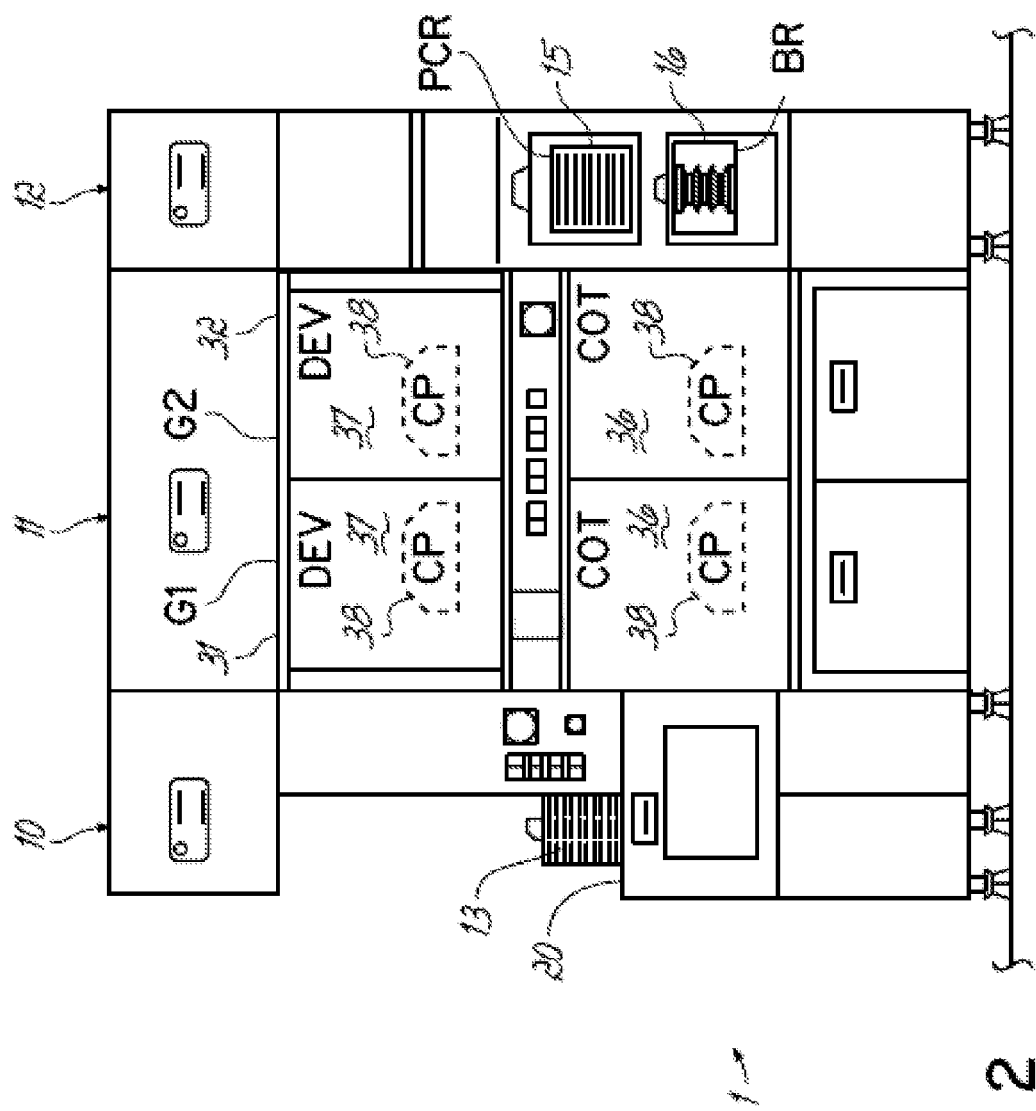
FIG. 2 is a front view of the coating/developing system of FIG. 1.
Figure 3:
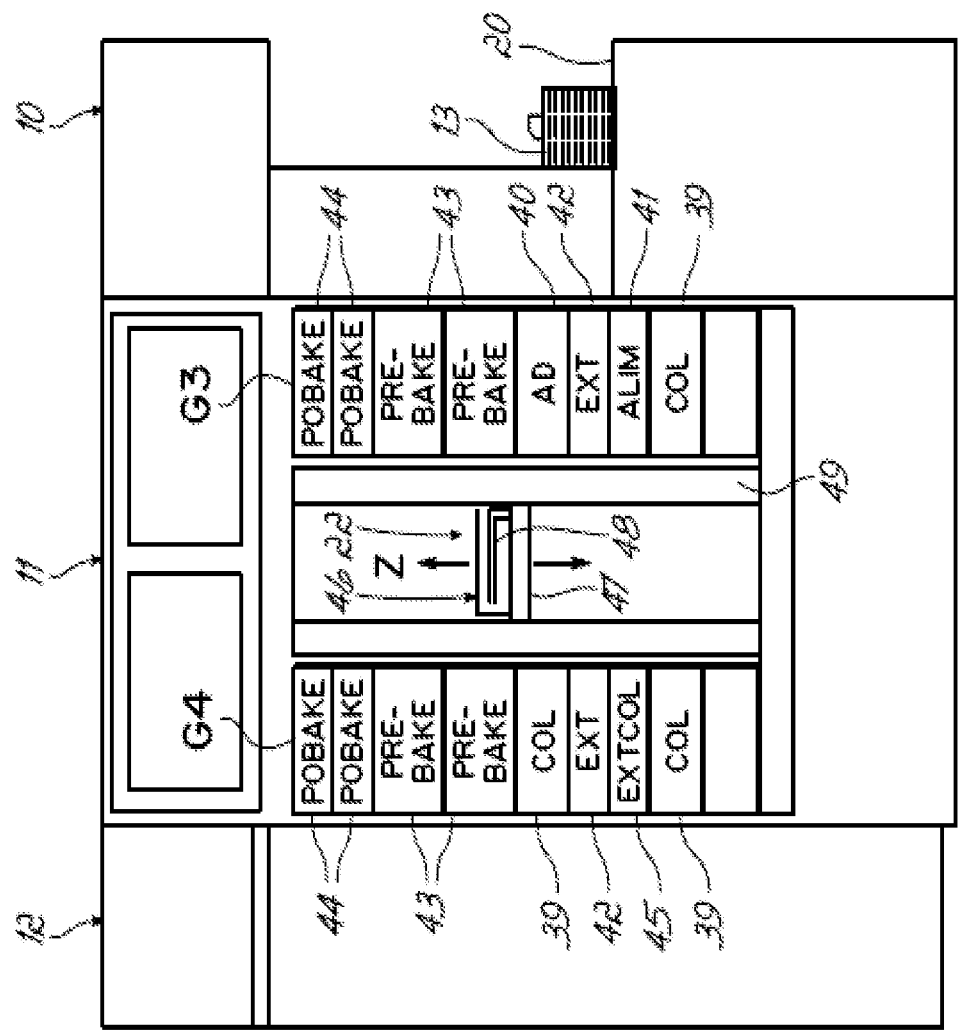
FIG. 3 is a partially cut-away back view of the coating/developing system of FIG. 1, as taken along line 3-3.

With reference to FIGS. 1-3, a coating/developing processing system 1 has a load/unload section 10, a process section 11, and an interface section 12. The load/unload section 10 has a cassette table 20 on which cassettes (CR) 13, each storing a plurality of semiconductor wafers (W) 14 (e.g., 25), are loaded and unloaded from the processing system 1. The process section 11 has various single wafer processing units for processing wafers 14 sequentially one by one. These processing units are arranged in predetermined positions of multiple stages, for example, within first (G1), second (G2), third (G3), fourth (G4) and fifth (G5) multiple-stage process unit groups 31, 32, 33, 34, 35. The interface section 12 is interposed between the process section 11 and one or more light exposure systems (not shown), and is configured to transfer resist coated wafers between the process section. The one or more light exposure systems can include a resist patterning system such as a photolithography tool that transfers the image of a circuit or a component from a mask or onto a resist on the wafer surface.

The coating/developing processing system 1 also includes a CD metrology system for obtaining CD metrology data from test areas on the patterned wafers. The CD metrology system may be located within the processing system 1, for example at one of the multiple-stage process unit groups 31, 32, 33, 34, 35. The CD metrology system can be a light scattering system such as an optical digital profilometry (ODP) system.

The ODP system may include a scatterometer, incorporating beam profile ellipsometry (ellipsometer), and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035). ODP software is available from Timbre Technologies Inc. (2953 Bunker Hill Lane, Santa Clara, Calif. 95054).

When performing optical metrology, such as scatterometry, a structure on a substrate, such as a semiconductor wafer or flat panel, is illuminated with electromagnetic (EM) radiation, and a diffracted signal received from the structure is utilized to reconstruct the profile of the structure. The structure may include a periodic structure, or a non-periodic structure. Additionally, the structure may include an operating structure on the substrate (i.e., a via, or contact hole, or an interconnect line or trench, or a feature formed in a mask layer associated therewith), or the structure may include a periodic grating or non-periodic grating formed proximate to an operating structure formed on a substrate. For example, the periodic grating can be formed adjacent a transistor formed on the substrate. Alternatively, the periodic grating can be formed in an area of the transistor that does not interfere with the operation of the transistor. The profile of the periodic grating is obtained to determine whether the periodic grating, and by extension the operating structure adjacent the periodic grating, has been fabricated according to specifications.

Still referring to FIGS. 1-3, a plurality of projections 20a are formed on the cassette table 20. A plurality of cassettes 13 are each oriented relative to the process section 11 by these projections 20a. Each of the cassettes 13 mounted on the cassette table 20 has a load/unload opening 9 facing the process section 11.

The load/unload section 10 includes a first sub-arm mechanism 21 that is responsible for loading/unloading the wafer W into/from each cassette 13. The first sub-arm mechanism 21 has a holder portion for holding the wafer 14, a back and forth moving mechanism (not shown) for moving the holder portion back and forth, an X-axis moving mechanism (not shown) for moving the holder portion in an X-axis direction, a Z-axis moving mechanism (not shown) for moving the holder portion in a Z-axis direction, and a θ (theta) rotation mechanism (not shown) for rotating the holder portion around the Z-axis. The first sub-arm mechanism 21 can gain access to an alignment unit (ALIM) 41 and an extension unit (EXT) 42 belonging to a third (G3) process unit group 33, as further described below.

With specific reference to FIG. 3, a main arm mechanism 22 is liftably arranged at the center of the process section 11. The process units G1-G5 are arranged around the main arm mechanism 22. The main arm mechanism 22 is arranged within a cylindrical supporting body 49 and has a liftable wafer transporting system 46. The cylindrical supporting body 49 is connected to a driving shaft of a motor (not shown). The driving shaft may be rotated about the Z-axis in synchronism with the wafer transporting system 46 by an angle of θ. The wafer transporting system 46 has a plurality of holder portions 48 movable in a front and rear direction of a transfer base table 47.

Units belonging to first (G1) and second (G2) process unit groups 31, 32, are arranged at the front portion 2 of the coating/developing processing system 1. Units belonging to the third (G3) process unit group 33 are arranged next to the load/unload section 10. Units belonging to a fourth (G4) process unit group 34 are arranged next to the interface section 12. Units belonging to a fifth (G5) process unit group 35 are arranged in a back portion 3 of the processing system 1.

With reference to FIG. 2, the first (G1) process unit group 31 has two spinner-type process units for applying a predetermined treatment to the wafer 14 mounted on a spin chuck (not shown) within the cup (CP) 38. In the first (G1) process unit group 31, for example, a resist coating unit (COT) 36 and a developing unit (DEV) 37 are stacked in two stages sequentially from the bottom. In the second (G2) process unit group 32, two spinner type process units such as a resist coating unit (COT) 36 and a developing unit (DEV) 37, are stacked in two stages sequentially from the bottom. In an exemplary embodiment, the resist coating unit (COT) 36 is set at a lower stage than the developing unit (DEV) 37 because a discharge line (not shown) for the resist waste solution is desired to be shorter than a developing waste solution for the reason that the resist waste solution is more difficult to discharge than the developing waste solution. However, if necessary, the resist coating unit (COT) 36 may be arranged at an upper stage relative to the developing unit (DEV) 37.

With reference to FIG. 1 and FIG. 3, the third (G3) process unit group 33 has a cooling unit (COL) 39, an alignment unit (ALIM) 41, an adhesion unit (AD) 40, an extension unit (EXT) 42, two prebaking units (PREBAKE) 43, and two postbaking units (POBAKE) 44, which are stacked sequentially from the bottom.

Similarly, the fourth (G4) process unit group 34 has a cooling unit (COL) 39, an extension-cooling unit (EXTCOL) 45, an extension unit (EXT) 42, another cooling unit (COL) 39, two prebaking units (PREBAKE) 43 and two postbaking units (POBAKE) 44 stacked sequentially from the bottom. Although, only two prebaking units 43 and only two postbaking units 44 are shown, G3 and G4 may contain any number of prebaking units 43 and postbaking units 44. Furthermore, any or all of the prebaking units 43 and postbaking units 44 may be configured to perform Post Exposure Bake (PEB), Post Application Bake (PAB), and Post Developing Bake (PDB) processes.

In an exemplary embodiment, the cooling unit (COL) 39 and the extension cooling unit (EXTCOL) 45, to be operated at low processing temperatures, are arranged at lower stages, and the prebaking unit (PREBAKE) 43, the postbaking unit (POBAKE) 44 and the adhesion unit (AD) 40, to be operated at high temperatures, are arranged at the upper stages. With this arrangement, thermal interference between units may be reduced. Alternatively, these units may have different arrangements.

At the front side of the interface section 12, a movable pick-up cassette (PCR) 15 and a non-movable buffer cassette (BR) 16 are arranged in two stages. At the backside of the interface section 12, a peripheral light exposure system 23 is arranged. The peripheral light exposure system 23 can contain a lithography tool. Alternately, the lithography tool and the ODP system may be remote to and cooperatively coupled to the coating/developing processing system 1. At the center portion of the interface section 12, a second sub-arm mechanism 24 is provided, which is movable independently in the X and Z directions, and which is capable of gaining access to both cassettes (PCR) 15 and (BR) 16 and the peripheral light exposure system 23. In addition, the second sub-arm mechanism 24 is rotatable around the Z-axis by an angle of θ and is designed to be able to gain access not only to the extension unit (EXT) 42 located in the fourth (G4) processing unit 34 but also to a wafer transfer table (not shown) near a remote light exposure system (not shown).

In the processing system 1, the fifth (G5) processing unit group 35 may be arranged at the back portion 3 of the backside of the main arm mechanism 22. The fifth (G5) processing unit group 35 may be slidably shifted in the Y-axis direction along a guide rail 25. Since the fifth (G5) processing unit group 35 may be shifted as mentioned, maintenance operation may be applied to the main arm mechanism 22 easily from the backside.

The prebaking unit (PREBAKE) 43, the postbaking unit (POBAKE) 44, and the adhesion unit (AD) 40 can each include a PAB curing system in which wafers 14 are heated to temperatures above room temperature.

Figure 4A:
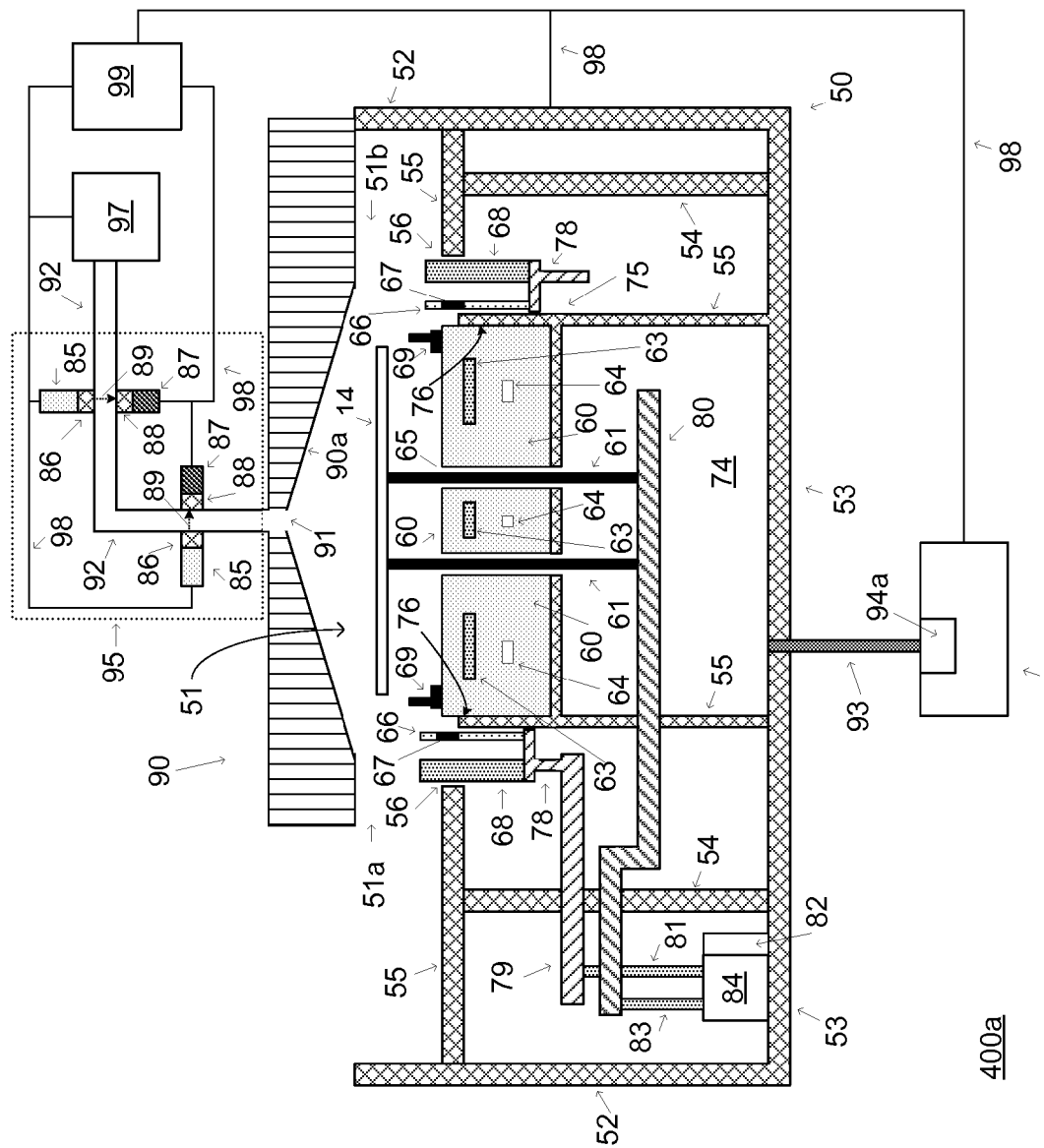
FIGS. 4A-4B illustrate simplified views of exemplary thermal processing systems in accordance with embodiments of the invention.
Figure 4B:
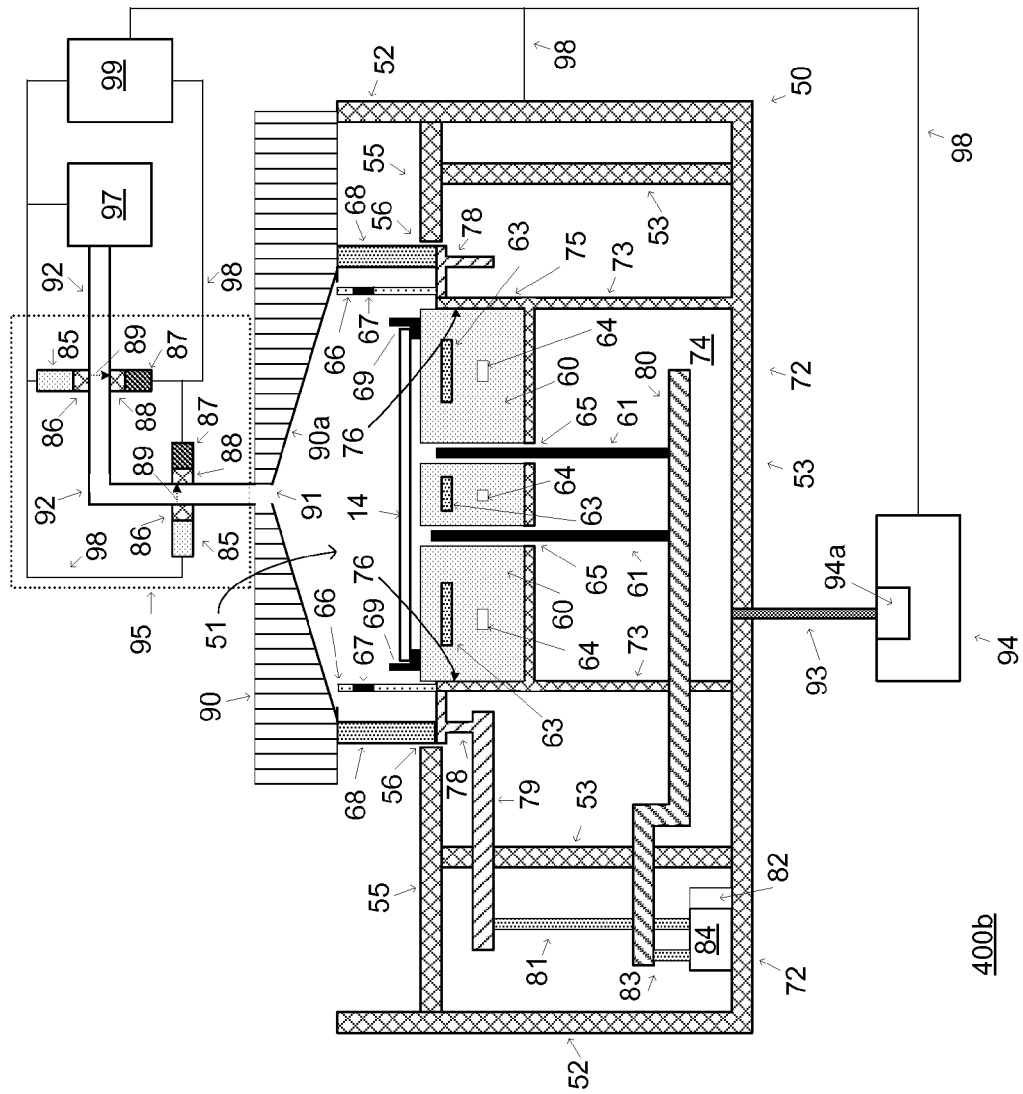

FIG. 4A and FIG. 4B show views of thermal processing systems (400a, 400b). In some embodiments, the thermal processing systems (400a, 400b) can be configured to perform Post Application Bake (PAB) procedures. Alternatively, the thermal processing systems (400a, 400b) may be configured to perform Post Exposure Bake (PEB) procedures. A simplified cross-sectional view of the thermal processing unit 50 is shown in each of the thermal processing systems (400a, 400b). A simplified view of an Exhaust Gas Analyzer (EGA) subsystem 95 is shown in each of the thermal processing systems (400a, 400b), and exemplary views of a process gas subsystem 94, and a controller 99 are shown in each of the thermal processing systems (400a, 400b).

The EGA subsystem 95 can be coupled to the thermal processing unit 50 using one or more exhaust lines 92, and the exhaust lines 92 can be configured with one or more monitoring windows (86, 88) therein. The EGA subsystem 95 can include a plurality of optical sources 85 and optical receivers 87, and at least one optical source 85 and/or optical receiver 87 can be coupled to each of the monitoring windows (86, 88). The controller 99 can be coupled to the thermal processing unit 50, the process gas subsystem 94, the optical sources 85 and optical receivers 87 in the EGA subsystem 95, and the exhaust subsystem 97 using one or more bi-directional signal busses 98. In addition, the controller 99 can be coupled to the one or more of the optical sources 85 and one or more of the optical receivers 87 in the EGA subsystem 95 using one or more fiber optic cables in the bi-directional signal busses 98.

In various examples, the optical sources 85, the optical receivers 87, and/or the monitoring windows (86, 88) can be single frequency devices, can be narrow band devices, or can be wideband devices, or any combination thereof.

Controller 99 may be coupled to a processing system controller that are configured in the coating/developing processing system 1 and that can be configured to provide data to the thermal processing systems (400a, 400b). The data can include wafer information, layer information, process information, and metrology information. Wafer information can include composition data, size data, thickness data, and temperature data. Layer information can include the number of layers, the composition of the layers, and the thickness of the layers. Process information can include data concerning previous steps and the current step. Metrology information can include optical digital profile data, such as critical dimension (CD) data, profile data, and uniformity data, and optical data, such as refractive index (n) data and extinction coefficient (k) data. For example, CD data and profile data can include information for features and open areas in one or more layers, and can include uniformity data.

As shown in FIG. 4A and FIG. 4B, the thermal processing unit 50 includes a processing chamber 51, a bake plate 60, and at least one bake plate cover assembly 90. One or more resistance heaters 63 can be embedded in the bake plate 60, and one or more temperature sensors 64 can be embedded in the bake plate 60. In addition, additional sensors (not shown) can be used to measure other chamber conditions, and each sensor can be a physical sensor and/or a virtual sensor. The bake plate cover assembly 90 can include an inner surface 90a that can be configured to form a portion of the processing chamber 51. For example, the wafer 14 can be 200 mm, 300 mm, or 450 mm in diameter, and the diameter of the bake plate can be 2-10 mm greater than the diameter of the wafer 14.

The thermal processing unit 50 can include at least one vertical sidewall 52, and at least one bottom wall 72 coupled to the at least one vertical sidewall 52. The vertical sidewall 52 and the bottom wall 72 can have circular, or elliptical, or square, or rectangular shapes. The thermal processing unit 50 can include at least one first interior wall 53 and one or more second interior walls 73 coupled to the bottom wall 72 and/or the horizontal shielding plate 55. The first interior wall 53 and the second interior wall 73 can have circular, or elliptical, or square, or rectangular shapes. At least one horizontal shielding plate 55 can be coupled to at least one of the vertical sidewalls 52, and the horizontal shielding plate 55 can have a circular, or an elliptical, or a square, or a rectangular shape.

A first opening 56 can be formed at the center of the horizontal shielding plate 55, and the first opening 56 can have a circular, or an elliptical, or a square, or a rectangular shape. A first supporting plate 75 configured below the horizontal shielding plate 55 within the first opening 56, and the first supporting plate 75 can have circular, or elliptical, or a square, or a rectangular shape. The first supporting plate 75 can include a mounting region 76 that can be formed at the center of the first supporting plate 75 and the bake plate 60 can be configured in the mounting region 76. The bake plate 60 and the mounting region 76 can have circular, or elliptical, or square, or rectangular shapes.

The first supporting plate 75 can be coupled to at least one of the bottom walls 72 using one or more of the second interior walls 73. Alternatively, the first supporting plate 75 may be configured and/or mounted differently. In some examples, one or more of the second interior walls 73 can be positioned within the compartment 74 or can be used to form at least one portion of the compartment 74.

The bake plate 60 and the first supporting plate 75 can include a plurality of through-holes 65 and a plurality of lift pins 61 can be inserted into the through-holes 65. The lift pins 61 can be connected to and supported by a first support arm 80, which is further connected to and supported by a first lifting rod 83 of a first lifting cylinder 84. When the first lifting rod 83 is actuated to move relative to the first lifting cylinder 84, the lift pins 61 can move vertically relative to the bake plate 60, thereby lifting or lowering the wafer 14 from the upper surface of the bake plate 60.

In addition, the shutter 68, the supply ring 66 can be configured proximate to the horizontal shielding plate 55 within the first opening 56, and the second supporting plate 78 can have circular, or elliptical, or a square, or a rectangular shape. At least one shutter 68 and at least one supply ring 66 can be coupled to the top surface of the second supporting plate 78, and the shutter 68 and the supply ring 66 can have circular, or elliptical, or square, or rectangular shapes. The second supporting plate 78 can be connected to and supported by a second support arm 79, which is further connected to and supported by a second lifting rod 81 of a second lifting cylinder 82. When the second lifting rod 81 is actuated to move vertically relative to the second lifting cylinder 82, the shutter 68 and the supply ring 66 can be can move vertically relative to the bake plate 60, thereby opening or closing the process chamber 51.

Air holes 67 can be formed along the periphery of the supply ring 66 at intervals of central angles of about two degrees. The air holes 67 can communicate with a cooling gas supply source (not shown). Alternatively, the supply ring 66 may be configured differently and/or mounted differently. When the supply ring 66 is in the "up" position, a gas, such as nitrogen gas or air, can be exhausted using the air holes 67. For example, air holes 67 can be used to expose one or more surfaces of the bake plate 60 to an inert gas stream for rapidly cooling the one or more surfaces and the rest of the bake plate 60 when a wafer is not present on the bake plate 60. For example, the inert gas can include argon (Ar) or nitrogen ($N_2$). In addition, air holes 67 can be used to expose one or more surfaces of the wafer 14 to an inert gas stream for rapidly cooling the one or more surfaces of the wafer 14 when a wafer is not positioned on the bake plate 60.

Furthermore, a plurality of small wafer supports 69 can be formed on an upper surface of the bake plate 60 for accurately positioning the wafer 14. When the wafer 14 is mounted on the bake plate 60, the top portions of these small wafer supports 69 can contact the backside surface of the wafer 14, and a small gap can be established between the wafer 14 and the bake plate 60 that prevents the backside surface of the wafer 14 from being strained and/or damaged. Alternatively, other wafer support means may be used.

In FIG. 4A, the thermal processing unit 50 is shown in the transfer mode, and the process chamber 51 is shown in an open configuration. When the process chamber is in an open configuration, openings 51a and 51b can be formed at a front surface side (aisle side of the main arm mechanism 22) and a rear surface side of the processing chamber 51, respectively. The wafer 14 can be loaded into and unloaded from the processing chamber 51 through the openings 51a, and 51b.

The lift pins 61, the first support arm 80, the first lifting rod 83 of the first lifting cylinder 84 can be in an "up" position, and the when the lift pins 61 are in the first "up" position the wafer 14 can be in a "transfer" position as shown in FIG. 4A. When the first lifting rod 83 is actuated to protrude from the first lifting cylinder 84, the lift pins 61 can protrude from the bake plate 60, thereby lifting the wafer 14 from the upper surface of the bake plate 60.

In addition, the shutter 68, the supply ring 66, the second supporting plate 78, the second lifting rod 81 of the second lifting cylinder 82 can be in a first "down" position, and the when the shutter 68 and the supply ring 66 are in the "down" position the wafer 14 can be in a transfer position as shown in FIG. 4A. When the second lifting rod 81 is in a first position as shown in FIG. 4A, the shutter 68 and the supply ring 66 can be in a "down" position and openings 51a, and 51b can be established in the process chamber 51 and wafer 14 can be transferred into or out of the process chamber 51.

In FIG. 4B, the thermal processing unit 50 is shown in an operating mode, and the process chamber 51 is shown in a closed configuration. When the process chamber is in a closed configuration, the shutter 68, the supply ring 66 can be used to close the openings 51a, and 51b. The wafer 14 can be positioned proximate to the top surface of the bake plate 60 and can be processes in the closed process chamber 51.

The lift pins 61, the first support arm 80, the first lifting rod 83 of the first lifting cylinder 84 can be in a "down" position, and the when the lift pins 61 are in the "down" position the wafer 14 can be in a "process" position as shown in FIG. 4B. When the first lifting rod 83 is actuated to protrude from the first lifting cylinder 84, the lift pins 61 can protrude from the bake plate 60, thereby lifting the wafer 14 from the upper surface of the bake plate 60.

In addition, the shutter 68, the supply ring 66, the second supporting plate 78, the second lifting rod 81 of the second lifting cylinder 82 can be in an "up" position, and when the shutter 68 and the supply ring 66 are in the "up" position the wafer 14 can be in the "process" position as shown in FIG. 4B. When the second lifting rod 81 is in the second position as shown in FIG. 4B, the shutter 68 and the supply ring 66 can be in an "up" position and openings 51a, and 51b can be closed and wafer 14 can be processed in the closed process chamber 51.

Gas generated from the surface of the wafer 14 before, during, and/or after the curing procedure can be exhausted through the exhaust port 91 configured in the bake lid cover assembly 90 and vented from the processing chamber 51 via exhaust line 92 to a EGA subsystem 95.

With reference to FIGS. 4A and 4B, a compartment 74 is defined by the horizontal shielding plate 55, two interior walls 53, and a bottom wall 72 formed below the horizontal shielding plate 55. Bake plate supporting plate 75, second supporting plate 78, second support arm 79, first support arm 80, and lifting cylinders 82, 84 can be arranged in the compartment 74.

With reference to FIGS. 4A and 4B, at least one Exhaust Gas Analyzer (EGA) subsystem 95 can be coupled to one or more exhaust lines 92 of the thermal processing unit 50. The exhaust lines 92 can be configured with one or more first monitoring windows 86 and one or more second monitoring windows 88. The first monitoring window 86 and the second monitoring window 88 can be configured using transparent tubing material, such as glass or quartz. Alternatively, the monitoring windows may be configured differently. At least one optical source 85 can be coupled to each of the first monitoring windows 86, and at least one optical receiver 87 can be coupled to each of the second monitoring windows 88. Alternatively, the optical devices may be configured differently. In addition, at least one optical signal 89 can be established between at least one optical source 85 and at least one optical receiver 87 through the first monitoring window 86 and the second monitoring window 88. The optical sources 85 and the optical receivers can be with each other to optimize the measured value for the optical signal 89. In addition, the measured value for the optical signal 89 can be used to determine the trace gas data, the amount of contamination on the monitoring windows (86 and 88), the amount of contamination in the exhaust lines 92, and/or the amount of contamination in the processing chamber 51.

For example, the exhaust lines 92 can include one or more flexible hoses so the bake lid cover assembly 90 can move back and forth between transfer procedures and thermal processing procedures. In some examples, the EGA subsystem 95 can operate during transfer procedures to determine if the inner surface 90a is clean or is contaminated, and when the EGA subsystem 95 determines that the inner surface 90a is contaminated, the thermal processing unit 50 can be taken off-line to prevent particles from being created on the wafer 14.

The optical sources 85 and the optical receivers 87 that are configured in the EGA subsystem 95 can be used to measure the exhaust gasses from the processing chamber 51 and/or the wafer 14 before, during, and/or after one or more PAB procedures are performed.

In some embodiments, the exhaust (trace) gas data obtained from the optical sources 85 and the optical receivers 87 configured in the EGA subsystem 95 can be used as feedback or feed-forward data to control the PAB procedure that is currently being performed, can be used as teaching data to control or optimize a future PAB procedure, can be used to determine when the wafer temperature is incorrect, can be used to determine if the processing chamber 51, the exhaust lines 92, or the monitoring windows are contaminated, can be used in real-time to the PAB procedure for the next wafer in a wafer lot, can be used to determine when to stop a PAB procedure, or can be used to determine when to perform a cleaning procedure. For example, teaching data can be obtained from a teaching procedure.

Alternatively, the exhaust gas data obtained from the optical sources 85 and the optical receivers 87 configured in the EGA subsystem 95 may be used as feedback or feed-forward data to control the PEB procedure that is currently being performed, can be used as teaching data to control or optimize a future PEB procedure, can be used to determine when the wafer temperature is incorrect, can be used to determine if the processing chamber 51, the exhaust lines 92, or the monitoring windows are contaminated, can be used in real-time to the PEB procedure for the next wafer in a wafer lot, can be used to determine when to stop a PEB procedure, or can be used to determine when to perform a cleaning procedure.

FIG. 5A and FIG. 5B illustrate exemplary bake plates in accordance with embodiments of the invention. FIG. 5A illustrates a first bake plate 60a having a plurality of circular (annular) segments (510, 520, and 530). For example, a plurality of resistance heaters (515, 525, and 535) can be embedded in a plurality of circular (annular) segments (510, 520, and 530) in the first bake plate 60a, and a plurality of temperature sensors 64 can be configured in the first bake plate 60a. In an alternate embodiment, bake plate 60a may incorporate a cooling element and/or a combined heating/cooling element rather than a heating element.

FIG. 5B illustrates a second bake plate 60b having a plurality of first multi-section circular (annular) segments (510a, 510b, 510c, and 510d); a plurality of second multi-section circular (annular) segments (520a, 520b, 520c, and 520d); and a plurality of third multi-section circular (annular) segments (530a, 530b, 530c, and 530d). For example, a first multi-segmented resistance heater (515a, 515b, 515c and 515d) can be embedded in the first multi-section circular (annular) segments (510a, 510b, 510c, and 510d) in the second bake plate 60b; a second multi-segmented resistance heater (525a, 525b, 525c and 525d) can be embedded in the second multi-section circular (annular) segments (520a, 520b, 520c, and 520d) in the second bake plate 60b; a third multi-segmented resistance heater (535a, 535b, 535c and 535d) can be embedded in the third multi-section circular (annular) segments (530a, 530b, 530c, and 530d) in the second bake plate 60b. In addition, a plurality of temperature sensors 64a can be configured in the second bake plate 60b. In an alternate embodiment, second bake plate 60b may incorporate a cooling element and/or a combined heating/cooling element rather than a heating element.

Controller 99 can comprise a microprocessor, a memory (e.g., volatile and/or non-volatile memory), and a digital I/O port. A program stored in the memory may be utilized to control the aforementioned components of the thermal processing systems (400a and 400b) according to a PAB and/or PEB process recipe. Controller 99 can be configured to analyze the exhaust gas data, the temperature data, and/or the CD metrology data, to compare this data and/or other data to historical and/or real-time exhaust data limits, and to use the comparison to change a PAB and/or PEB process recipe and/or control the processing system components during PAB and/or PEB procedures.

The process gas subsystem 94 may comprise one or more flow control devices 94a that can be used to control the type and amount of process gas provided by the supply line 93. In some embodiments, the process gas subsystem 94 can be used to control the flow of an inert gas to the thermal processing unit 50 and/or can be used to control the flow of a solvent to the thermal processing unit 50.

Figure 6:
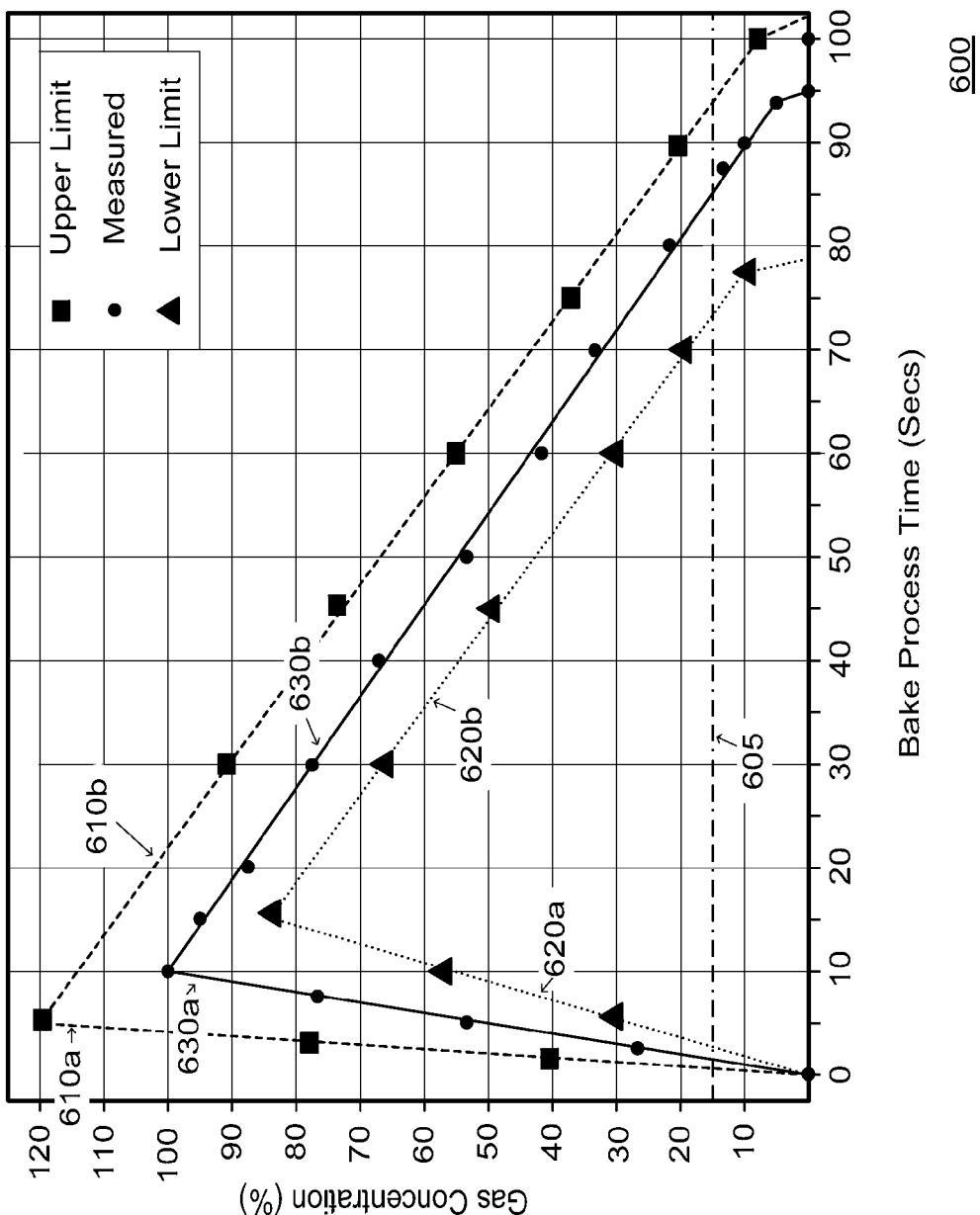
FIG. 6 illustrates exemplary exhaust gas data for a PAB procedure in accordance with embodiments of the invention.

FIG. 6 illustrates exemplary exhaust gas data for a PAB procedure in accordance with embodiments of the invention. Three exemplary graphs are shown in which gas concentration (%) is plotted versus bake process time (sec), but this is not required for the invention. For example, values above 100% can occur when limits and/or thresholds are being established or before values are normalized. In some cases, the gas concentration data can be used to plot combination data for a plurality of the exhaust gasses or gas components, and in other cases, the gas concentration data can be used to plot a single exhaust gas or a single gas component.

The first graph (610a and 610b) can represent upper threshold profile for concentration data for a first wafer and can be identified as upper limit concentration data for the first wafer during a first PAB procedure; the second graph (620a and 620b) can represent lower threshold profile for concentration data for the first wafer and can be identified as upper limit concentration data for the first wafer during a first PAB procedure; and the third graph (630a and 630b) can represent measured concentration data for the first wafer during a first PAB procedure. In addition, a threshold level 605 is shown for the first PAB procedure.

Figure 7:
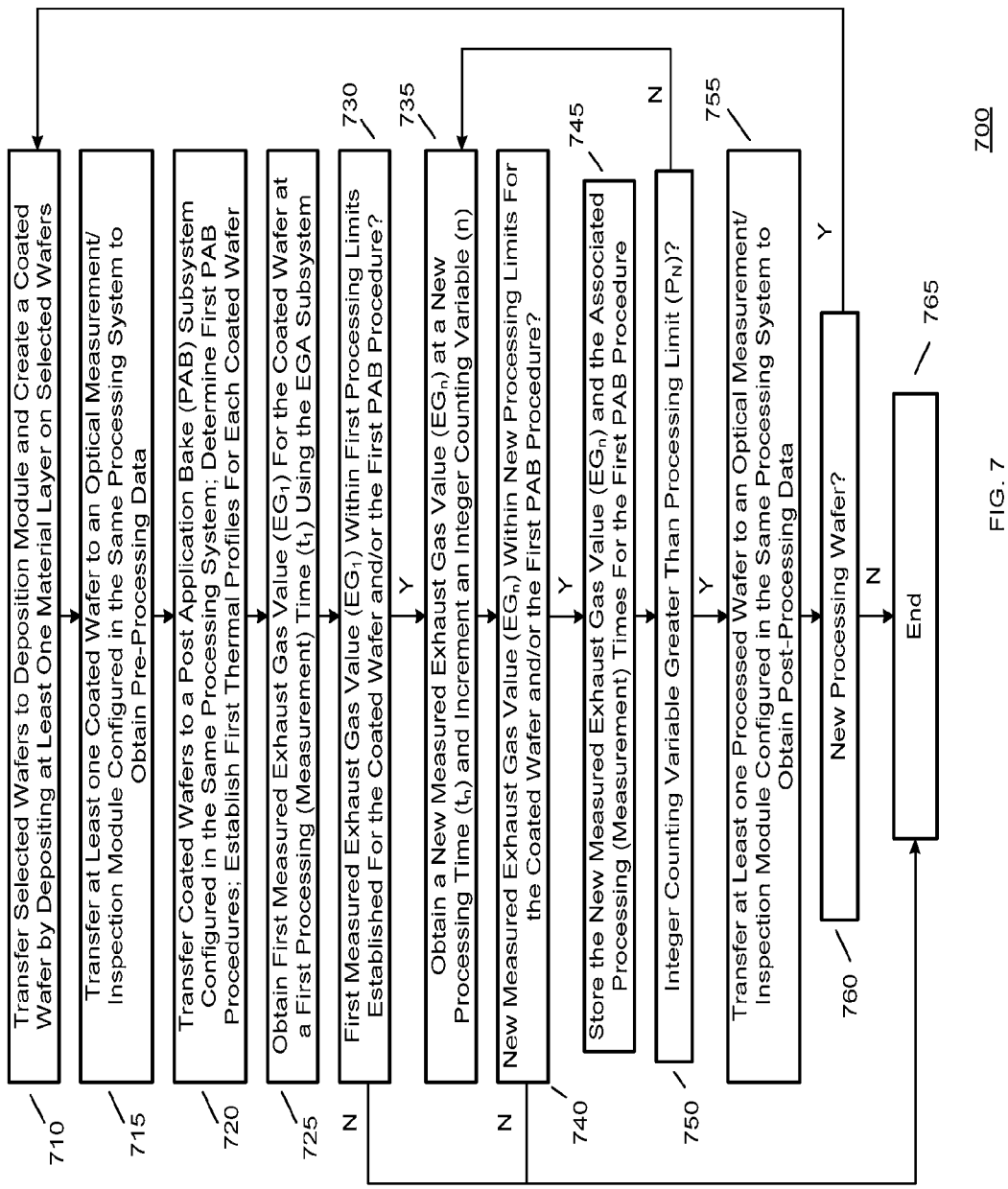
FIG. 7 shows a simplified process flow diagram for an exemplary method of processing a coated wafer in accordance with embodiments of the invention.

FIG. 7 shows a simplified process flow diagram for an exemplary method of processing a coated wafer in accordance with embodiments of the invention. In the illustrated embodiment shown in FIG. 7, an exemplary Post Application Bake (PAB) procedure 700 is shown that can be used to process one or more wafers using the thermal processing systems (400a and 400b). The PAB procedure 700 represents an exemplary method for operating and/or controlling the thermal processing unit (50) and the exhaust gas analyzer (EGA) subsystems (95) that are configured in the thermal processing systems (400a and 400b). For example, one or more substrate/wafers can be processed using a plurality of thermal processing units (50) and a plurality of EGA subsystems (95) configured in the coating/developing processing system 1 illustrated in FIGS. 1-3.

In 710, the selected wafer can be transferred to a deposition module that can be configured in the coating/developing processing system 1 illustrated in FIGS. 1-3, and at least one material layer can be deposited on the selected wafer thereby creating a coated wafer that can be used in the PAB procedure. In some examples, the selected wafer can be selected from a group of inspected wafers, and the inspected wafers can have particle and/or defect data associated therewith.

In 715, one or more of the coated wafers can be transferred from the deposition module to an inspection module or an optical measurement module that can be configured in the coating/developing processing system 1 illustrated in FIGS. 1-3. For example, pre-processing inspection data and/or optical metrology data can be obtained for one or more of the coated wafers, and this data can be used in the PAB procedure.

When the coated wafer has one or more deposited layers thereon, the deposited layers can include Anti-Reflective Coating (ARC) material, Bottom Anti-Reflective Coating (BARC) material, Top Anti-Reflective Coating (TARC) material, dual-tone resist material, freezable or frozen resist material, hardened resist material, Ultra-Violet (UV) resist material, Extreme Ultra-Violet (EUV) resist material, organic material, or non-organic material, or any combination thereof.

In 720, one or more of the coated wafers can be selected and/or transferred to a thermal processing unit (50) that can be configured in the coating/developing processing system 1 illustrated in FIGS. 1-3. A PAB procedure can be determined for each wafer using historical and/or real-time data. For example, the shutter (68) and/or the supply ring (66) can be configured in a first position, thereby establishing an open state for the processing chamber (51). In addition, the processing chamber (51) can be closed after the coated wafer is positioned on the bake plate (60, 60a, 60b). The shutter (68) and/or the one supply ring (66) can be configured in a second position proximate a bottom surface of a bake lid cover assembly (90), thereby closing the processing chamber (51).

The thermal processing units (50) can be used to establish a first thermal profile for each of the coated wafers, and the first PAB procedure that has been determined for each wafer can be used to establish the thermal profiles. For example, a plurality of measured exhaust gas values (data points) can be obtained from the EGA subsystem (95) when each of the coated wafers is heated during the first PAB procedure. The first PAB procedure can include a first number (N) of processing (measurement) times $(t_N)$, and each of the processing (measurement) times $(t_n)$ can have a measured exhaust gas value $(EG_n)$ associated therewith.

The first PAB temperature profile can be established for a bake plate (60) in an open processing chamber (51) that is configured in a thermal processing unit (50). In some embodiments, the first PAB temperature profile can have a concave shape, and the temperature at the edge of the bake plate (60) can be higher than the temperature at the center of the bake plate (60). In other embodiments, the first PAB temperature profile can have a convex shape, and the temperature at the edge of the bake plate (60) can be lower than the temperature at the center of the bake plate (60). In some other embodiments, the first PAB temperature profile can have a substantially flat shape, and the temperature at the edge of the bake plate (60) can be substantially the same as the temperature at the center of the bake plate (60). For example, the bake plate temperature can vary from about 80° Celsius to about 250° Celsius during the PAB procedures, and the bake plate temperature differences between the center and edge temperatures can vary from about 2° Celsius to about 20° Celsius during the PAB procedures.

In some embodiments, the first temperature profiles can be established for the bake plate (60, 60a) using at least one resistance heater (63, 515, 525, and 535) embedded in the bake plate (60, 60a), and at least one temperature sensor (64) can be embedded in the bake plate (60, 60a) and can be used to determine the first temperature profile for the bake plate (60, 60a).

In other embodiments, the first temperature profiles can be established for the bake plate (60b) using one or more of the first multi-segmented resistance heaters (515a, 515b, 515c and 515d) in the first multi-section circular (annular) segments (510a, 510b, 510c, and 510d) in the second bake plate (60b); using one or more of the second multi-segmented resistance heaters (525a, 525b, 525c and 525d) in the second multi-section circular (annular) segments (520a, 520b, 520c, and 520d) in the second bake plate 60b; and/or using one or more of the third multi-segmented resistance heaters (535a, 535b, 535c and 535d) in the third multi-section circular (annular) segments (530a, 530b, 530c, and 530d) in the second bake plate 60b. In addition, at least one temperature sensor (64) embedded in the second bake plate (60b) and can be used to determine the first temperature profile for the second bake plate (60b).

In addition, the shutter (68) and/or the supply ring (66) can be configured in a first position, thereby establishing an open state for the processing chamber (51).

In 725, a first measured exhaust gas value $(EG_1)$ can be obtained at the first processing (measurement) time $(t_1)$, In some embodiments, the total processing time $(t_{proc})$ for a PAB procedure can vary from about 50 seconds to about 300 seconds.

In 730, a first query can be performed to determine if the first measured exhaust gas value $(EG_1)$ is within first processing (measurement) limits for the first PAB procedure 700. When the first measured exhaust gas value $(EG_1)$ is within at least one of the first processing (measurement) limits for the selected PAB wafer, the PAB procedure 700 can branch to 735 and can continue as shown in FIG. 7, and when the measured exhaust gas value $(EG_1)$ is not within one or more of the processing (measurement) limits for the selected PAB wafer, procedure 700 can branch to 760 and can continue as shown in FIG. 7.

In 735, a new measured exhaust gas value $(EG_n)$ can be obtained for the coated wafer at the new processing (measurement) times $(t_n)$, and an integer counting variable (n) can be incremented. For example, the integer counting variable (n) can vary from one to an integer value greater than ten.

In 740, a new query can be performed to determine if the new measured exhaust gas value $(EG_n)$ is within new processing (measurement) limits for the first PAB procedure. When the new measured exhaust gas value $(EG_n)$ is within at least one of the new processing (measurement) limits for the first PAB procedure, procedure 700 can branch to 745, and when the new measured exhaust gas value $(EG_n)$ is not within one or more of the new processing (measurement) limits for the first PAB procedure, procedure 700 can branch to 760 and can continue as shown in FIG. 7.

In 745, the new measured exhaust gas value $(EG_n)$ and the associated processing (measurement) time $(t_n)$ can be stored and/or compared to historical data previously obtained for the first PAB procedure and/or associated wafer.

In 750, the current value for the integer counting variable (n) can be compared to the first number $(P_N)$ of processing (measurement) times. When the current value for the integer counting variable (n) is less than or equal to the first number $(P_N)$ of processing (measurement) times, procedure 700 can branch back to 735 and continue as shown in FIG. 7. When the current value for the integer counting variable (n) is greater than the first number ($P_N$) of processing (measurement) times, procedure 700 can branch to 755 and continue as shown in FIG. 7.

In 755, one or more of the processed wafers can be transferred from the thermal processing unit (50) to an inspection module or an optical measurement module that can be configured in the coating/developing processing system 1 illustrated in FIGS. 1-3. For example, post-processing inspection data and/or optical metrology data can be obtained for one or more of the coated wafers, and this data can be used in the PAB procedure.

In 760, a query can be performed to determine if a new wafer is required. When a new wafer is required, a new wafer can be selected and procedure 700 can branch back to 710 and continue as shown in FIG. 7. When a new wafer is not required procedure 700 can branch to 765 and end as shown in FIG. 7.

In various embodiments, the exhaust gas data and the exhaust gas limit data can include wavelength and/or intensity data for exhaust gas components associated with deposited top coat (TC) barrier material, deposited TARC material, deposited BARC material, deposited ARC material, deposited photoresist material, deposited metal gate material, deposited non-organic material, or deposited organic material, or any combination thereof. In other embodiments, the exhaust gas data and the exhaust gas limit data can include concentration data for gas components associated with deposited top coat (TC) barrier material, deposited TARC material, deposited BARC material, deposited ARC material, deposited photoresist material, deposited poly-gate material, deposited metal gate material, deposited non-organic material, or deposited organic material, or any combination thereof. In still other embodiments, the exhaust gas data and the exhaust gas limit data can include concentration data for exhaust gas components for solvents and/or cleaning fluids associated with deposited top coat (TC) barrier material, deposited TARC material, deposited BARC material, deposited ARC material, deposited photoresist material, deposited poly-gate material, deposited metal gate material, deposited non-organic material, or deposited organic material, or any combination thereof. In addition, the PAB temperature profiles for the bake plate (60) can be modified during the PAB procedure.

In some examples, the one or more corrective procedures can be performed when the wafer is not on the bake plate (60), or when the incorrect layer has been deposited on the wafer, or when a layer has not been deposited on the wafer. For example, when the wafer is not on the bake plate (60), the preheating can be stopped to prevent damage to the bake plate; when a layer has not been deposited on the wafer), the preheating can be stopped to prevent damage to the wafer and/or the bake plate; and when the incorrect layer has been deposited on the wafer, the preheating can be stopped, the wafer can be removed from the bake plate and the wafer can be reworked. In addition, the processing chamber (51) can remain open when the PAB baking/curing procedure is stopped.

Figure 8:
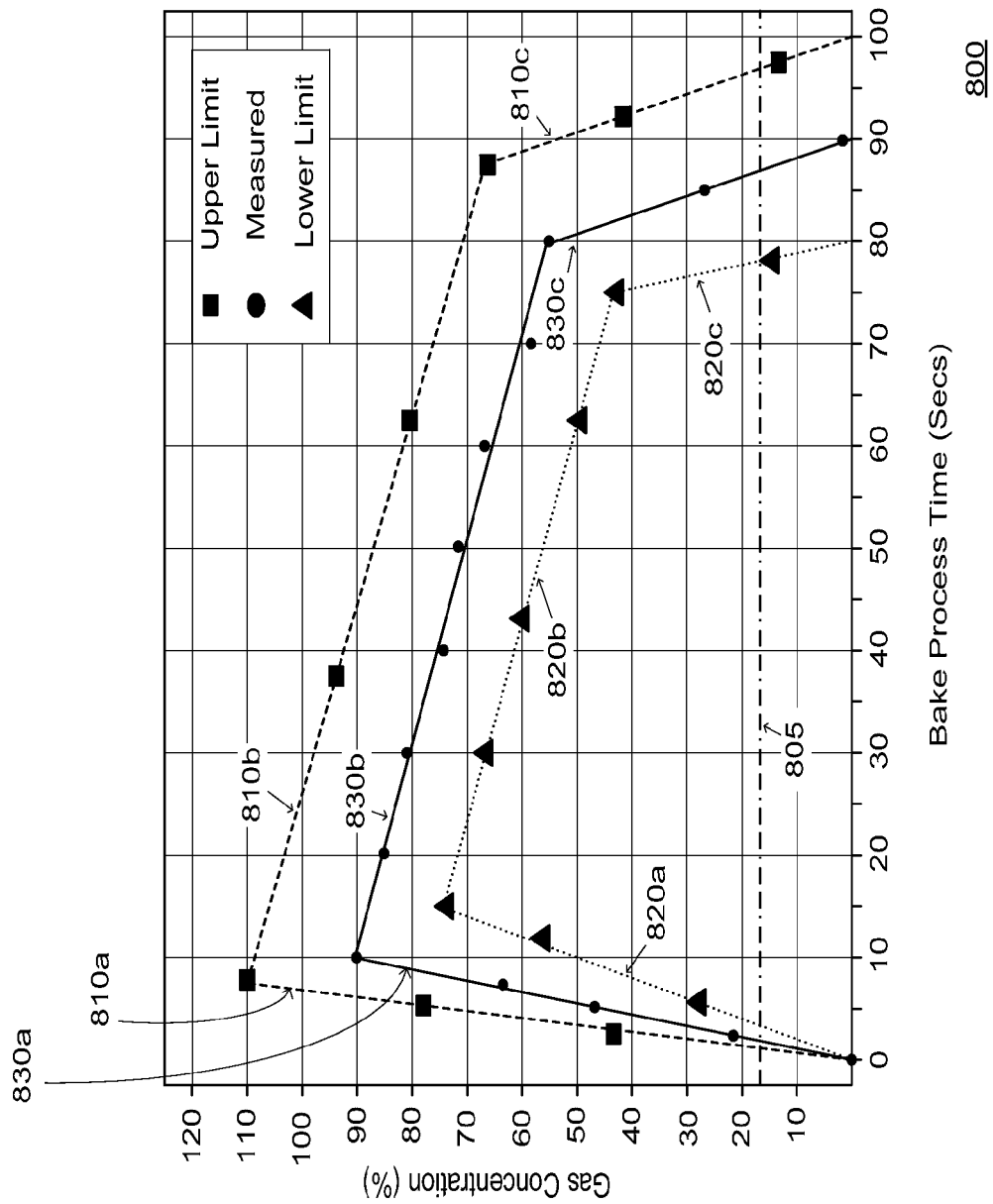
FIG. 8 illustrates exemplary exhaust gas data for another PAB procedure in accordance with embodiments of the invention.

FIG. 8 illustrates additional exemplary exhaust gas data for a Post Application Bake (PAB) procedure in accordance with embodiments of the invention. Three exemplary PAB graphs are shown in which gas concentration (%) is plotted versus bake process time (sec), but this is not required for the invention. For example, values above 100% can occur when limits and/or thresholds are being established or before values are normalized. In some cases, the PAB gas concentration data can be used to plot combination data for a plurality of the exhaust gasses or gas components for the PAB procedure, and in other cases, the gas concentration data can be used to plot a single exhaust gas or a single gas component for the PAB procedure or a PAB teaching procedure.

The first graph (810a, 810b, and 810c) can represent upper threshold profile for concentration data for a first wafer and can be identified as upper limit concentration data for the first wafer during a PAB processing procedure or a PAB teaching procedure; the second graph (820a, 820b, and 820c) can represent lower threshold profile for concentration data for the first wafer and can be identified as upper limit concentration data for the first wafer during a PAB processing procedure or a PAB teaching procedure; and the third graph (830a, 830b, and 830c) can represent measured concentration data for the first wafer during a PAB processing procedure or a PAB teaching procedure. In addition, a threshold level 805 is shown that can be used in the PAB procedure or the PAB teaching procedure.

Figure 9:
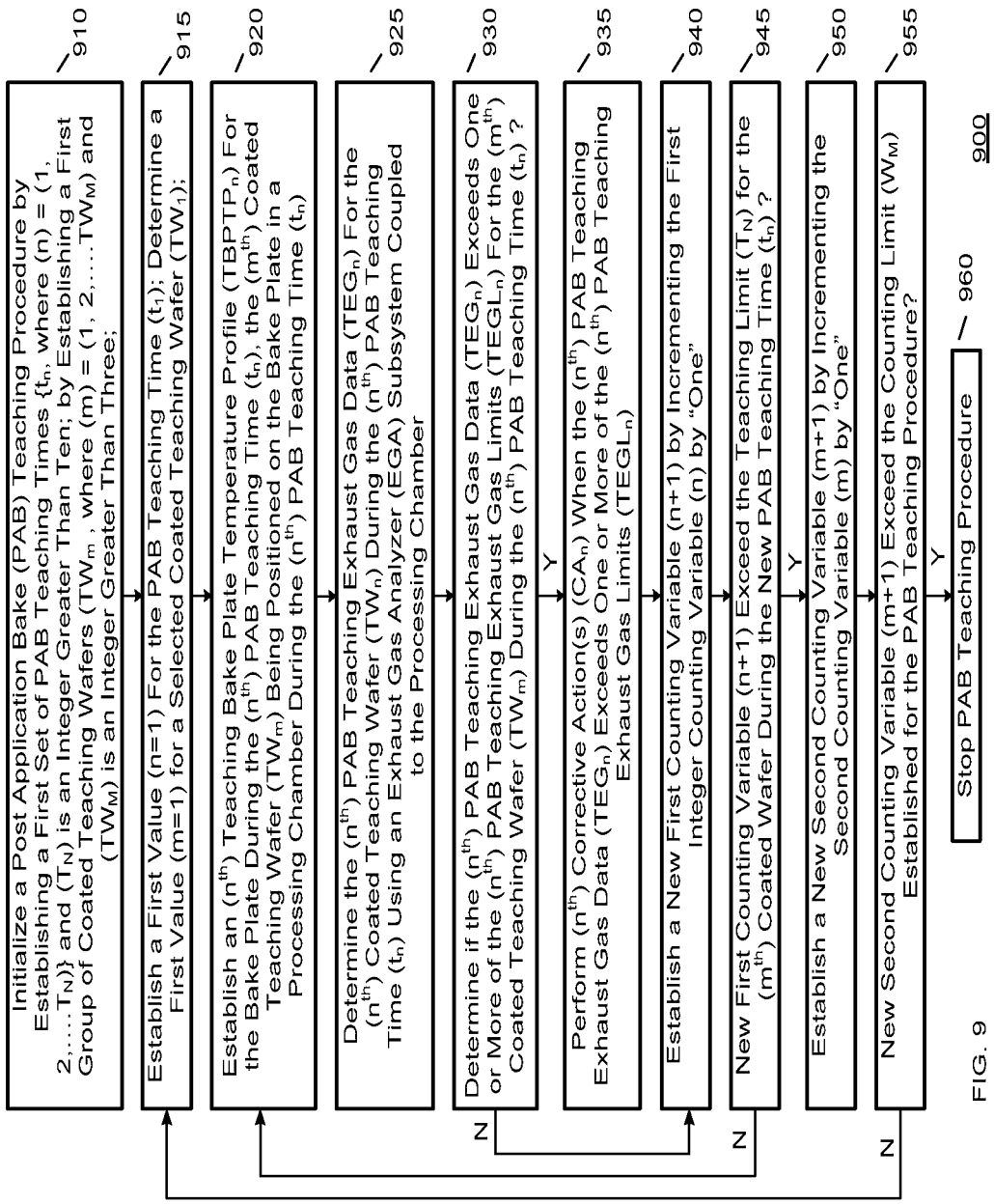
FIG. 9 shows a simplified process flow diagram for a method of teaching a thermal processing system to perform a PAB procedure in accordance with embodiments of the invention.

FIG. 9 shows a simplified process flow diagram for another exemplary method of processing a wafer using a Post Application Bake (PAB) teaching procedure in accordance with embodiments of the invention. A PAB teaching procedure can be determined for each wafer using historical and/or real-time data. In the illustrated embodiment shown in FIG. 9, an exemplary PAB teaching procedure 900 is shown that can be used to process one or more teaching wafers using a thermal processing systems (400a and 400b). In addition, the PAB teaching procedure 900 represents an exemplary method for teaching, operating, and/or controlling the thermal processing unit (50) and the exhaust gas analyzer (EGA) subsystems (95) that are configured in the thermal processing systems (400a and 400b). For example, one or more coated substrate/wafers can be processed using a plurality of thermal processing units (50) and a plurality of EGA subsystems (95) configured in the coating/developing processing system 1 illustrated in FIGS. 1-3.

The coated teaching wafers can have one or more deposited layers thereon, and the deposited layers can include Anti-Reflective Coating (ARC) material, Bottom Anti-Reflective Coating (BARC) material, Top Anti-Reflective Coating (TARC) material, dual-tone resist material, freezable or frozen resist material, hardened resist material, Ultra-Violet (UV) resist material, Extreme Ultra-Violet (EUV) resist material, organic material, or non-organic material or any combination thereof. For example, during some PAB teaching procedures, the coated wafer can have at least one photoresist layer deposited thereon. In addition, the processing chamber (51) can be closed after the coated wafer is positioned. The shutter (68) and/or the supply ring (66) can be configured in a second position proximate a bottom surface of a bake lid cover assembly (90), thereby closing the processing chamber (51).

In 910, initialization procedures can be performed for the PAB teaching procedure. In some embodiments, a first counting variable (n) and a teaching limit ($T_N$) can be established for the teaching times ($t_n$); the first counting variable (n) can have an integer value greater than zero, and the teaching limit ($T_N$) can be an integer having a value greater than ten. In addition, a second counting variable (m) and a counting limit ($W_M$) can be established for the coated wafers ($W_m$); the second counting variable (m) can have an integer value greater than zero; and the counting limit ($W_M$) can be an integer having a value greater than three. Alternatively, the teaching limit ($T_N$) and/or the counting limit ($W_M$) may have different values. In some examples, the teaching times ($t_n$) can be used to illustrate time points, and in other examples, the teaching times ($t_n$) can be used to illustrate periods of time. In various embodiments, the total teaching time ($T_{Teach}$) for a PAB teaching procedure can vary from about 50 seconds to about 300 seconds.

In 915, a first value (n=1) can be created to established a first PAB teaching time ($t_1$), and an initial value (m=1) can be determined for the first PAB teaching wafer (TW).

In some embodiments, one or more coated teaching wafers can be transferred to a deposition module that can be configured in the coating/developing processing system 1 illustrated in FIGS. 1-3, and at least one material layer can be deposited on the selected teaching wafer thereby creating a coated teaching wafer that can be used in the PAB teaching procedure. In addition, one or more of the coated teaching wafers can be transferred from the deposition module to an inspection module or an optical measurement module that can be configured in the coating/developing processing system 1 illustrated in FIGS. 1-3. For example, pre-processing teaching data can be obtained for one or more of the coated teaching wafers, and the pre-processing teaching data can include inspection data and/or optical metrology data that can be used in the PAB teaching procedure. In addition, the selected teaching wafer(s) can be selected from a group of inspected wafers, and the inspected wafers can have particle and/or defect data associated therewith.

When a coated teaching wafer is transferred to the processing chamber (51) in the thermal processing unit (50), the shutter (68) and/or the supply ring (66) can be configured in a first position, thereby establishing an open state for the processing chamber (51). In addition, the processing chamber (51) can be closed after the coated teaching wafer is positioned on the bake plate (60, 60a, 60b). The shutter (68) and/or the one supply ring (66) can be configured in a second position proximate a bottom surface of a bake lid cover assembly (90), thereby closing the processing chamber (51).

In 920, an ($n^{th}$) teaching bake plate temperature profile (TBPTP$_n$) can be established for the bake plate during an ($n^{th}$) PAB teaching time ($t_n$), and the ($m^{th}$) coated teaching wafer (TW$_m$) can be positioned on the bake plate. For example, one or more ($n^{th}$) teaching input power (TIP$_n$) values can be provided to at least one resistance heater embedded in the bake plate during the ($n^{th}$) PAB teaching time ($t_n$).

Different teaching bake plate temperature profiles (TBPTID$_1$ - - - TBPTP$_n$) can be established for a bake plate (60) during the different PAB teaching times ($t_1$ - - - $t_n$), and a coated teaching wafer can be transferred from a deposition unit and can be positioned on the bake plate (60) that can be "preheated" during the first PAB teaching time ($t_1$). In some embodiments, the teaching bake plate temperature profiles (TBPTID$_1$ - - - TBPTP$_n$) can have concave shapes, and the temperatures at the edge of the bake plate (60) can be higher than the temperatures at the center of the bake plate (60). In other embodiments, the teaching bake plate temperature profiles (TBPTID$_1$ - - - TBPTP$_n$) can have convex shapes, and the temperatures at the edge of the bake plate (60) can be lower than the temperatures at the center of the bake plate (60). In some other embodiments, the teaching bake plate temperature profiles (TBPTID$_1$ - - - TBPTP$_n$) can have substantially flat shapes, and the temperatures at the edge of the bake plate (60) can be substantially the same as the temperatures at the center of the bake plate (60). For example, the bake plate temperatures can vary from about 80° Celsius to about 250° Celsius during the PAB teaching times ($t_n$), and the bake plate temperature differences between the center and edge temperatures can vary from about 2° Celsius to about 20° Celsius during the PAB teaching times ($t_n$).

In some embodiments, the teaching bake plate temperature profiles (TBPTID$_1$ - - - TBPTP$_n$) can be established for the bake plate (60, 60a) using at least one resistance heater (63, 515, 525, and 535) embedded in the bake plate (60, 60a), and at least one temperature sensor (64) can be embedded in the bake plate (60, 60a) and can be used to determine the teaching bake plate temperature profiles (TBPTID$_1$ - - - TBPTP$_n$) for the bake plate (60, 60a) during the PAB teaching procedures.

In other embodiments, the teaching bake plate temperature profiles (TBPTID$_1$ - - - TBPTP$_n$) can be established for the bake plate (60b) using one or more of the first multi-segmented resistance heaters (515a, 515b, 515c and 515d) in the first multi-section circular (annular) segments (510a, 510b, 510c, and 510d) in the second bake plate (60b); using one or more of the second multi-segmented resistance heaters (525a, 525b, 525c and 525d) in the second multi-section circular (annular) segments (520a, 520b, 520c, and 520d) in the second bake plate 60b; and/or using one or more of the third multi-segmented resistance heaters (535a, 535b, 535c and 535d) in the third multi-section circular (annular) segments (530a, 530b, 530c, and 530d) in the second bake plate 60b. In addition, at least one temperature sensor (64) embedded in the second bake plate (60b) and can be used to determine the teaching bake plate temperature profiles (TBPTID$_1$ - - - TBPTP$_n$) for the second bake plate (60b) during the PAB teaching procedures.

In 925, the ($n^{th}$) teaching exhaust gas data (TEG$_n$) can be determined for the ($m^{th}$) coated teaching wafer (TW$_m$) during the ($n^{th}$) PAB teaching time ($t_n$). For example, an ($n^{th}$) "teaching" wafer temperature profile (TWTP$_n$) can be established for the ($m^{th}$) coated teaching wafer (TW$_m$) during the ($n^{th}$) PAB teaching time ($t_n$), and an Exhaust Gas Analyzer (EGA) subsystem can be coupled to a top portion of the processing chamber, and the EGA subsystem can be configured to determine the ($n^{th}$) teaching exhaust gas data (TEG$_n$) for the ($m^{th}$) coated teaching wafer (TW$_m$) during the ($n^{th}$) PAB teaching time ($t_n$).

The ($n^{th}$) teaching exhaust gas data (TEG$_n$), the ($n^{th}$) "teaching" wafer temperature profile (TWTP$_n$), and the ($n^{th}$) PAB teaching time ($t_n$) can be stored and/or compared to historical data previously obtained for the PAB teaching procedure and/or the ($m^{th}$) coated teaching wafer (TW$_m$).

Different "teaching" wafer temperature profiles (TWTID$_1$ - - - TWTP$_n$) can be established for the coated teaching wafers when the coated teaching wafers are heated by the bake plate (60) during the during the different PAB teaching times ($t_1$ - - - $t_n$). In addition, the "teaching" wafer temperature profiles (TWTID$_1$ - - - TWTP$_n$) can be established using at least one resistance heater (63) and at least one temperature sensor (64) that can be embedded in the bake plate (60). For example, temperature changes can occur in the first "teaching" bake plate temperature profile (TBPTP$_1$) when the coated teaching wafer is initially positioned on the bake plate (60), and these temperature changes can be used to determine the wafer uniformity and/or the first PAB "teaching" wafer temperature profile (TWTP$_1$).

In 930, a query can be performed to determine when the ($n^{th}$) teaching exhaust gas data (TEG$_n$) exceeds one or more ($n^{th}$) teaching exhaust gas limits (TEGL$_n$) during the ($n^{th}$) PAB teaching time ($t_n$).

In 935, the ($n^{th}$) corrective action (CA$_n$) can be performed when the ($n^{th}$) teaching exhaust gas data (TEG$_n$) exceeds one or more ($n^{th}$) teaching exhaust gas limits (TEGL$_n$) during the ($n^{th}$) PAB teaching time ($t_n$). In some examples, the one or more corrective procedures can be performed when the coated teaching wafer is not on the bake plate (60), or when the incorrect layer has been deposited on the teaching wafer, or when a layer has not been deposited on the coated teaching wafer. For example, corrective actions can be performed to prevent damage to the bake plate and/or the coated teaching wafer. In addition, the PAB teaching procedure can be stopped, and the processing chamber (51) can remain open or be opened when the corrective actions are performed; the coated teaching wafer can be removed from the bake plate, and the coated teaching wafer can be reworked.

In 940, a new first counting variable (n+1) can be established by incrementing the first counting variable (n), and the new first counting variable (n+1) can be compared to the teaching limit ($T_N$) established for the ($m^{th}$) coated teaching wafer ($TW_m$).

In 945, another query can be performed to determine when the new first counting variable (n+1) does not exceed the teaching limit ($T_N$) established for the ($m^{th}$) coated teaching wafer ($TW_m$). When the new first counting variable (n+1) does not exceed the teaching limit ($T_N$) established for the ($m^{th}$) coated teaching wafer ($TW_m$), procedure 900 can branch back to 920 and proceed as shown in FIG. 9. When the new first counting variable (n+1) exceeds the teaching limit ($T_N$) established for the ($m^{th}$) coated teaching wafer ($TW_m$), procedure 900 can branch back to 950 and proceed as shown in FIG. 9.

In 950, a new second counting variable (m+1) can be established by incrementing the second counting variable (m), when the new first integer counting variable (n+1) exceeds the teaching limit (PN) established for the ($m^{th}$) coated teaching wafer ($TW_m$).

In 955, another query can be performed to determine when the new second counting variable (m+1) does not exceed the counting limit ($W_M$) established for the PAB teaching procedure. When the new second counting variable (m+1) does not exceed the counting limit ($W_M$) established for the PAB teaching procedure, procedure 900 can branch to 915 and can continue as shown in FIG. 9. When the new second counting variable (m+1) exceeds the counting limit ($W_M$) established for the PAB teaching procedure, procedure 900 can branch to 960 and can be stopped as shown in FIG. 9.

In various embodiments, the "teaching" exhaust gas data and the "teaching" exhaust gas limit data can include wavelength and/or intensity data for exhaust gas components associated with deposited top coat (TC) barrier material, deposited TARC material, deposited BARC material, deposited ARC material, deposited photoresist material, deposited metal gate material, deposited non-organic material, or deposited organic material, or any combination thereof. In other embodiments, the "teaching" exhaust gas data and the "teaching" exhaust gas limit data can include concentration data for gas components associated with deposited top coat (TC) barrier material, deposited TARC material, deposited BARC material, deposited ARC material, deposited photoresist material, deposited poly-gate material, deposited metal gate material, deposited non-organic material, or deposited organic material, or any combination thereof. In still other embodiments, the "teaching" exhaust gas data and the "teaching" exhaust gas limit data can include concentration data for exhaust gas components for solvents and/or cleaning fluids associated with deposited top coat (TC) barrier material, deposited TARC material, deposited BARC material, deposited ARC material, deposited photoresist material, deposited poly-gate material, deposited metal gate material, deposited non-organic material, or deposited organic material, or any combination thereof. In addition, the PAB "teaching" temperature profiles for the bake plate (60) can be modified during the PAB teaching procedure.

In some examples, one or more solvent evaporation profiles and/or solvent evaporation rates can be calculated using the measured teaching exhaust gas data ($TEG_1$ - - - $TEG_n$) and associated "teaching" wafer temperature profiles ($TWTP_1$ - - - $TWTP_n$). In other examples, one or more photoresist drying profiles and/or photoresist drying rates can be calculated using the measured teaching exhaust gas data ($TEG_1$ - - - $TEG_n$) and associated "teaching" wafer temperature profiles ($TWTP_1$ - - - $TWTP_n$). In still other examples, one or more gas concentration profiles and/or gas flow rates can be calculated using the measured teaching exhaust gas data ($TEG_1$ - - - $TEG_n$) and associated "teaching" wafer temperature profiles ($TWTP_1$ - - - $TWTP_n$). In additional examples, one or more curing profiles and/or curing can be calculated using the measured teaching exhaust gas data ($TEG_1$ - - - $TEG_n$) and associated "teaching" wafer temperature profiles ($TWTID_1$ - - - $TWTP_n$).

In some embodiments, one or more of the coated teaching wafers that have been processed during the PAB teaching procedures can be transferred from the thermal processing unit (50) to an inspection module or an optical measurement module that can be configured in the coating/developing processing system 1 illustrated in FIGS. 1-3. For example, post-processing inspection data and/or optical metrology data can be obtained for one or more of the coated teaching wafers, and this data can be used in the PAB teaching procedure. In addition, the shutter (68) and/or the supply ring (66) can be configured in a first position, thereby establishing an open state for the processing chamber (51) at the start or the finish of the PAB teaching procedures.

In some embodiments, a new desired bake plate temperature profile ($BPTP_n$) can be established for the bake plate when a corrective action is performed, and the selected coated teaching wafer can be positioned on the bake plate when the corrective action is performed. For example, a new input power can be provided to at least one resistance heater embedded in the pre-heated bake plate when a corrective action is performed.

In addition, new exhaust gas data can be determined for the coated wafer when a corrective action is performed, and new wafer temperature profile ($WTP_n$) can be established for the coated wafer when a corrective action is performed, and the EGA subsystem can be configured to determine additional teaching exhaust gas data ($EG_n$) for the coated wafer when the corrective action is performed.

The new exhaust gas data ($EG_n$) can be measured for the coated wafer using the Exhaust Gas Analysis (EGA) subsystem (95). Most of the new exhaust gas data ($EG_n$) can be obtained when processing chamber (51) is closed, and other portions of the new exhaust gas data ($EG_n$) can be obtained when processing chamber (51) is closing and/or opening.

For example, one or more new corrective actions can be performed when the new exhaust gas data ($EG_n$) exceeds one or more new exhaust gas limits ($EGL_n$), and the PAB procedure can be updated using the new PAB processing difference data ($DIFF_n$). In addition, the new PAB processing difference data ($DIFF_n$) can be stored if the new exhaust gas data ($EG_n$) exceeds one or more new exhaust gas limits ($EGL_n$). In addition, the processing chamber (51) can remain open when the PAB teaching procedure is stopped.

In some embodiments, initial "teaching" exhaust gas data ($TEG_0$) can be determined for the PAB teaching procedure during the PAB pre-processing time ($tp_0$) before the coated teaching wafer is positioned on the bake plate; the initial "teaching" exhaust gas data ($TEG_0$) can be compared to historical exhaust gas data to determine if the processing chamber requires cleaning, to determine when the exhaust gas sensors/windows require cleaning, to determine when the exhaust system requires cleaning, and/or to determine when the bake plate requires cleaning; and the PAB teaching procedure can be stopped when cleaning procedures are required.

In some examples, upper limits for the measured PAB exhaust gas data can be illustrated using a first set of lines (810a, 810b, and 810c, FIG. 8); the lower limits for the measured PAB exhaust gas data can be illustrated using a second set of lines (820a, 820b, and 820c, FIG. 8); and the actual measured PAB exhaust gas data can be illustrated using a third set of lines (830a, 830b, and 830c, FIG. 8). In addition, upper limits for a first portion of the measured PAB exhaust gas data can be illustrated using one of the first lines (810a, FIG. 8); the lower limits for the first portion of the measured PAB exhaust gas data can be illustrated using one of the second set of lines (820a, FIG. 8); and the first portion of the actual first measured PAB exhaust gas data can be illustrated using one of the third set of lines (830a, FIG. 8). Alternatively, the lines (810a, 820a, and 830a) may have different shapes.

In some embodiments, when the processing chamber (51) is in an open state, a first PAB contamination level can be established for the processing chamber (51) and/or the EGA subsystem (95), using the first PAB exhaust gas data and one or more cleaning procedures can be performed when the first PAB contamination level exceeds a first PAB threshold value for an open chamber. For example, some cleaning procedures can be performed when processing chamber (51) is open. In other embodiments, the first PAB contamination level can be established for a closed or closing processing chamber (51). In addition, one or more cleaning procedures can be performed when the first PAB contamination level exceeds a first PAB threshold value for a closed chamber, and one or more cleaning procedures can be performed when processing chamber (51) is closed or closing.

For example, the first PAB exhaust data can include one or more optical signals having various intensities and wavelengths, and the EGA subsystem (95) can include optical sources and optical receivers that can be configured to determine the presence of a coated wafer, can be configured to determine the presence of a deposited layer on the coated wafer, and can be configured to determine the amount of out-gassing from the deposited layer, and all of these determinations can be performed using different wavelengths and intensity In some embodiments, PAB process state data can be determined during the PAB procedure or the PAB teaching procedure for the processing chamber (51) and/or the coated wafer using the first PAB exhaust gas data. For example, the PAB process state data can be used to determine when a coated wafer is on the bake plate (60) and a coated wafer is not on the bake plate (60). In addition, the first exhaust gas data can be used to determine when a correct layer has been deposited on the coated wafer and when an incorrect layer or no layer has been deposited on the coated wafer. For example, a first incorrect processing state can be established when a coated wafer is not present on the bake plate; other incorrect processing states can be established when a deposited layer is not present on the coated wafer; and additional incorrect processing states can be established when an incorrect material has been deposited on the coated wafer. Correct processing states can be established when the correct material has been deposited on the coated wafer, and the first PAB wafer temperature profile is correct.

During some PAB teaching procedures, one or more queries can be performed to determine if the PAB "teaching" state data is within the teaching limits established for the PAB teaching procedures. For example, the PAB "teaching" state data can have a null value when no teaching procedures have been performed; the PAB "teaching" state data can have a first value when a first teaching procedure has been performed; and the PAB "teaching" state data can have a second value when more than one teaching procedures have been performed. When the PAB "teaching" state data is not within at least one of the "teaching" limits established for the PAB "teaching" procedures, corrective action may be performed or the "teaching" procedure may be stopped. When the "teaching" state data is within one or more of the "teaching" limits established for the PAB "teaching" procedure, the PAB "teaching" procedure can continue.

In various embodiments, the PAB process state data and the PAB processing/teaching limit data can include wavelength and/or intensity data for exhaust gas components associated with deposited top coat (TC) barrier material, deposited top antireflective coating (TARC) material, deposited bottom antireflective coating (BARC) material, deposited photoresist material, deposited metal gate material, deposited non-organic material, or deposited organic material, or any combination thereof. In other embodiments, the PAB process state data and the PAB processing/teaching limit data can include concentration data for gas components associated with deposited top coat (TC) barrier material, deposited top antireflective coating (TARC) material, deposited bottom antireflective coating (BARC) material, deposited photoresist material, deposited poly-gate material, deposited metal gate material, deposited non-organic material, or deposited organic material, or any combination thereof. In still other embodiments, the PAB process state data and the PAB processing/teaching limit data can include concentration data for exhaust gas components for solvents and/or cleaning fluids associated with deposited top coat (TC) barrier material, deposited top antireflective coating (TARC) material, deposited bottom antireflective coating (BARC) material, deposited photoresist material, deposited poly-gate material, deposited metal gate material, deposited non-organic material, or deposited organic material, or any combination thereof. In addition, the PAB temperature profiles for the bake plate (60) can be modified during the PAB procedure or the PAB teaching procedure.

Controller 99 may be coupled to a processing system controller that is configured in the coating/developing processing system 1 and that can be configured to provide data to the thermal processing systems (400a and 400b) during the PAB procedure. The data can include wafer information, layer information, process information, and metrology information. Wafer information can include composition data, size data, thickness data, and temperature data. Layer information can include the number of layers, the composition of the layers, and the thickness of the layers. Process information can include data concerning previous steps and the current step. Metrology information can include optical digital profile data, such as critical dimension (CD) data, profile data, and uniformity data, and optical data, such as refractive index (n) data and extinction coefficient (k) data. For example, CD data and profile data can include information for features and open areas in one or more layers, and can include uniformity data.

Controller 99 can determine and/or control the exhaust gasses from the thermal processing unit 50 using the EGA subsystem 95 and/or the exhaust subsystem 97 to establish one or more exhaust gas profiles for each coated wafer. For example, controller 99 may use feed-forward data from the previously processed coated wafer to adjust the temperature of the current coated wafer, and can compare the current PAB exhaust gas data to PAB exhaust gas data received from previously processed coated wafers. In addition, the exhaust gas data, the temperature data, the defect data, the particle data, and/or the metrology data used by the controller 99 can be dependent upon the types of deposited masking layer materials used on the coated wafers.

Controller 99 can be configured to analyze the PAB exhaust gas data, the PAB temperature data, and/or the CD metrology data, to compare the PAB data and/or other data to historical and/or real-time PAB exhaust data limits, and to use the comparison to change a PAB procedures and/or control the processing system components during a PAB procedure.

The process gas subsystem 94 may comprise one or more flow control devices 94a that can be used to control the type and amount of process gas provided by the supply line 93 during the PAB procedure. In some embodiments, the process gas subsystem 94 can be used to control the flow of an inert gas to the thermal processing unit 50 and/or can be used to control the flow of a solvent to the thermal processing unit 50 during the PAB procedure.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative system and methods, and illustrative examples shown and described. Accordingly, departures may be made from such details without departing from the scope of applicants' general inventive concept.

What is claimed is:

1. A method of processing a wafer using a Post Application Bake (PAB)) procedure, the method comprising:
    transferring a plurality of selected wafers to one or more deposition modules, wherein a plurality of coated wafers are created by depositing a first material layer on each of the selected wafers;
    transferring at least one coated wafer to an inspection module coupled to at least one of the deposition modules, wherein pre-processing inspection data is determine by the inspection module;
    transferring a first coated wafer to a bake plate in a thermal processing unit coupled to one or more of the deposition modules, wherein a first wafer thermal profile is established for the first coated wafer using a pro heated bake plate, and wherein the first wafer thermal profile includes a measured exhaust gas value (EG.sub.n) is associated with each processing time from t.sub.1 to (t.sub.n);
    determining first exhaust gas data (EG.sub.1) for the first coated wafer at a first processing time (t.sub.1), the first processing time (t.sub.1) obtained from the first thermal profile, wherein the bake plate is configured within a processing chamber in the thermal processing unit and an Exhaust Gas Analyzer (EGA) subsystem is coupled to a top portion of the processing chamber, the EGA subsystem being configured to determine the first exhaust gas data (EG.sub.1), the first exhaust gas data (EG.sub.1) comprising two or more of exhaust gas data, temperature data, and/or critical dimension (CD) metrology data;
    comparing the first exhaust gas data (EG.sub.1) to corresponding processing lower limit and/or upper limit of historical data to the two or more of exhaust gas data, temperature data, and/or critical dimension (CD) metrology data established for the first coated wafer for the first processing time (t.sub.1) and comparing the first exhaust gas data (EC sub to corresponding processing lower limit and/or upper limit of real time data to the two or more of exhaust gas data, temperature data, and/or critical dimension (CD) metrology data, the comparing performed for at least two of exhaust gas data, temperature data, and/or critical dimension (CD) metrology data;
    continuing to process the first coated wafer if the first exhaust gas data (EG.sub.1) does not exceed at least one of the corresponding processing limits established for the first coated wafer; and
    stopping the PAS procedure if the first exhaust as data (EG.sub.1) exceeds one or more of the corresponding processing limits established for the first coated wafer and for the first processing time (t.sub.1);
    and
    wherein values of the corresponding processing lower and upper limits are established for each value of the first processing time from (t.sub.1) to t.sub.n.

2. The method of claim 1, wherein the first material layer comprises organic material, non-organic material, radiation-sensitive material, non-radiation-sensitive material, solvent material, photoresist material, or anti-reflective coating (ARC) material, or any combination thereof.

3. The method of claim 1, further comprising: determining if the first coated wafer is on the bake plate using the first exhaust gas data (EG.sub.1); and stopping the PAB procedure when the wafer is not on the bake plate.

4. The method of claim 1, further comprising:
    determining if a correct first material layer is on the first coated wafer using the first exhaust gas data (EG.sub.1); and
    stopping the PAB procedure when the correct first material layer is not on the first coated wafer.

5. The method of claim 1, wherein the first exhaust gas data (EG.sub.1) includes concentration data for gas components associated with top coat (TC) barrier material, top antireflective coating (TARC) material, bottom antireflective coating (BARC) material, photoresist material, sacrificial material, filler material, barrier material, poly-gate material, or metal gate material, or any combination thereof.

6. The method of claim 1, wherein the first exhaust gas data (EG.sub.1) includes wavelength data for gas components associated with top coat (TC) barrier material, top antireflective coating (TARC) material, bottom antireflective coating (BARC) material, photoresist material, sacrificial material, filler material, barrier material, poly-gate material, or metal gate material, or any combination thereof.

7. The method of claim 1, wherein the first exhaust gas data (EG.sub.1) includes concentration data for gas components associated with solvents for top coat (TC) barrier material, solvents for top antireflective coating (TARC) material, solvents for bottom antireflective coating (BARC) material, solvents for photoresist material, solvents for sacrificial material, solvents for filler material, solvents for barrier material, solvents for poly-gate material, or solvents for metal gate material, or any combination thereof.

8. The method of claim 1 wherein the first exhaust gas data (EG.sub.1) is used as feedback or feed-forward to control the PAB procedure that is currently being performed.

9. The method of claim 1 wherein the first exhaust gas data (EG.sub.1) is used as teaching data to control or optimize a future PAB procedure.

10. The method of claim 1 wherein the first exhaust gas data ($EG.sub.1$) is used to determine if the processing chamber, exhaust lines, or monitoring windows are contaminated.

11. The method of claim 1 wherein the first exhaust gas data ($EG.sub.1$) is used to determine if the wafer temperature is incorrect.

12. The method of claim 1 wherein the first exhaust gas data ($EG.sub.1$), is used to determine when to perform a cleaning procedure.

13. The method of claim 1 wherein instead of stopping the PAB procedure if the first exhaust gas data ($EG.sub.1$) exceeds one or more of the corresponding processing limits established for the first coated wafer, performing a corrective action to adjust two or more of the exhaust gas data, the temperature data, and/or the critical dimension (CD) metrology data.

14. The method of claim 13 wherein the corrective action comprises providing new teaching input power values to one or more resistance heaters embedded in the bake plate.

15. The method of claim 13 wherein the corrective action comprises updating at least one bake plate temperature profile ($BPTPn+1$) that is to be established for the bake plate.

16. The method of claim 13 wherein the corrective action comprises determining if the coated teaching wafer is correctly positioned on the pre-heated bake plate and stopping the PAB teaching procedure when the coated teaching wafer is not correctly positioned on the pre-heated bake plate.

17. The method of claim 13 wherein the corrective action comprises determining if the coated teaching wafer has a correct material layer thereon and stopping the PAB teaching procedure when the coated teaching wafer when the coated teaching wafer has an incorrect material layer thereon.

18. The method of claim 13 further comprising updating the PAB procedure when corrective action is performed that results with new bake plate temperature profile, new one or more exhaust gas concentrations, new one or more gas flow rates, and/or new water temperature.

* * * * *

UNITED STATES PATENT AND TRADEMARK OFFICE
CERTIFICATE OF CORRECTION

PATENT NO. : 8,808,788 B2  
APPLICATION NO. : 12/886361  
DATED : August 19, 2014  
INVENTOR(S) : Thomas E. Winter Page 1 of 1

It is certified that error appears in the above-identified patent and that said Letters Patent is hereby corrected as shown below:

In the Claims

In Claim 1, Column 21, Line 40, delete "determine" and insert --determined--.

In Claim 1, Column 22, Line 1, after "data", delete "EC sub" and insert --(EG.sub.1)--.

In Claim 1, Column 22, Line 12, delete "PAS" and insert --PAB--.

In Claim 17, Column 24, Line 12, delete "when the coated teaching wafer".

Signed and Sealed this  
Twenty-eighth Day of October, 2014

Michelle K. Lee  
*Deputy Director of the United States Patent and Trademark Office*